(12) United States Patent
Lin

(10) Patent No.: US 12,550,414 B2
(45) Date of Patent: Feb. 10, 2026

(54) WAFER-LEVEL DIE SINGULATION USING BURIED SACRIFICIAL STRUCTURE

(71) Applicant: Taiwan Semiconductor Manufacturing Company, Ltd., Hsinchu (TW)

(72) Inventor: Hung-Te Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 381 days.

(21) Appl. No.: 18/362,921

(22) Filed: Jul. 31, 2023

(65) Prior Publication Data

US 2025/0048714 A1     Feb. 6, 2025

(51) Int. Cl.
| | |
|---|---|
| H10D 84/03 | (2025.01) |
| H01L 21/683 | (2006.01) |
| H01L 21/762 | (2006.01) |
| H01L 21/768 | (2006.01) |

(52) U.S. Cl.
CPC ....... *H10D 84/035* (2025.01); *H01L 21/6835* (2013.01); *H01L 21/76267* (2013.01); *H01L 21/76819* (2013.01); *H01L 2221/68318* (2013.01)

(58) Field of Classification Search
CPC .............. H10D 84/035; H01L 21/6835; H01L 21/76267; H01L 21/76819; H01L 2221/68318; H01L 23/481; H01L 24/08; H01L 24/13; H01L 24/16; H01L 25/18; H01L 25/50

See application file for complete search history.

(56) References Cited

U.S. PATENT DOCUMENTS

| | | | | |
|---|---|---|---|---|
| 9,837,302 | B1* | 12/2017 | Goktepeli | ........... H04W 88/005 |
| 2002/0093041 | A1* | 7/2002 | Hong | ................ H01L 21/76224 |
| | | | | 257/E21.546 |

(Continued)

FOREIGN PATENT DOCUMENTS

| | | |
|---|---|---|
| TW | I697949 B | 7/2020 |
| TW | I719982 A | 3/2021 |
| TW | 202245263 A | 11/2022 |

*Primary Examiner* — Alexander G Ghyka
(74) *Attorney, Agent, or Firm* — KILPATRICK TOWNSEND & STOCKTON LLP

(57) ABSTRACT

Semiconductor wafers and methods of fabricating the same are provided. An example semiconductor wafer has multiple die regions separated by a die spacing region and includes a wafer substrate, multiple dies disposed over the wafer substrate, and multiple buried sacrificial structures corresponding to the multiple dies. Each die is located in the corresponding die region and further includes a die substrate, an integrated circuit (IC) device disposed in the die substrate, and a multi-layer interconnect structure disposed on the IC device. The buried sacrificial structure is surrounding the die substrate and disposed between the die and the wafer substrate. The buried sacrificial structure further includes a bottom portion disposed in the die region and a side portion circumferentially connected to the bottom portion. The side portion is located in the die spacing region surrounding the corresponding die and disposed on the sidewall of the die substrate.

20 Claims, 19 Drawing Sheets

(56) References Cited

U.S. PATENT DOCUMENTS

| | | | |
|---|---|---|---|
| 2007/0170542 A1* | 7/2007 | Derderian | H01L 21/76224 |
| | | | 257/E21.546 |
| 2016/0163583 A1* | 6/2016 | Liu | H10D 62/126 |
| | | | 438/430 |
| 2016/0165731 A1* | 6/2016 | Hurwitz | H01L 23/5389 |
| | | | 216/17 |
| 2021/0249357 A1* | 8/2021 | Li | H01L 23/544 |
| 2021/0343840 A1* | 11/2021 | Liu | H10D 30/0297 |
| 2022/0399282 A1* | 12/2022 | Hu | G03F 7/70475 |
| 2023/0020251 A1 | 1/2023 | Or-Bach et al. | |
| 2023/0274979 A1* | 8/2023 | Shariff | H01L 21/78 |
| | | | 257/620 |

\* cited by examiner

WAFER-LEVEL DIE SINGULATION USING BURIED SACRIFICIAL STRUCTURE

FIELD

Embodiments of the present disclosure relate generally to wafer-level singulation, and more particularly to wafer-level singulation using buried sacrificial structure.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1A:
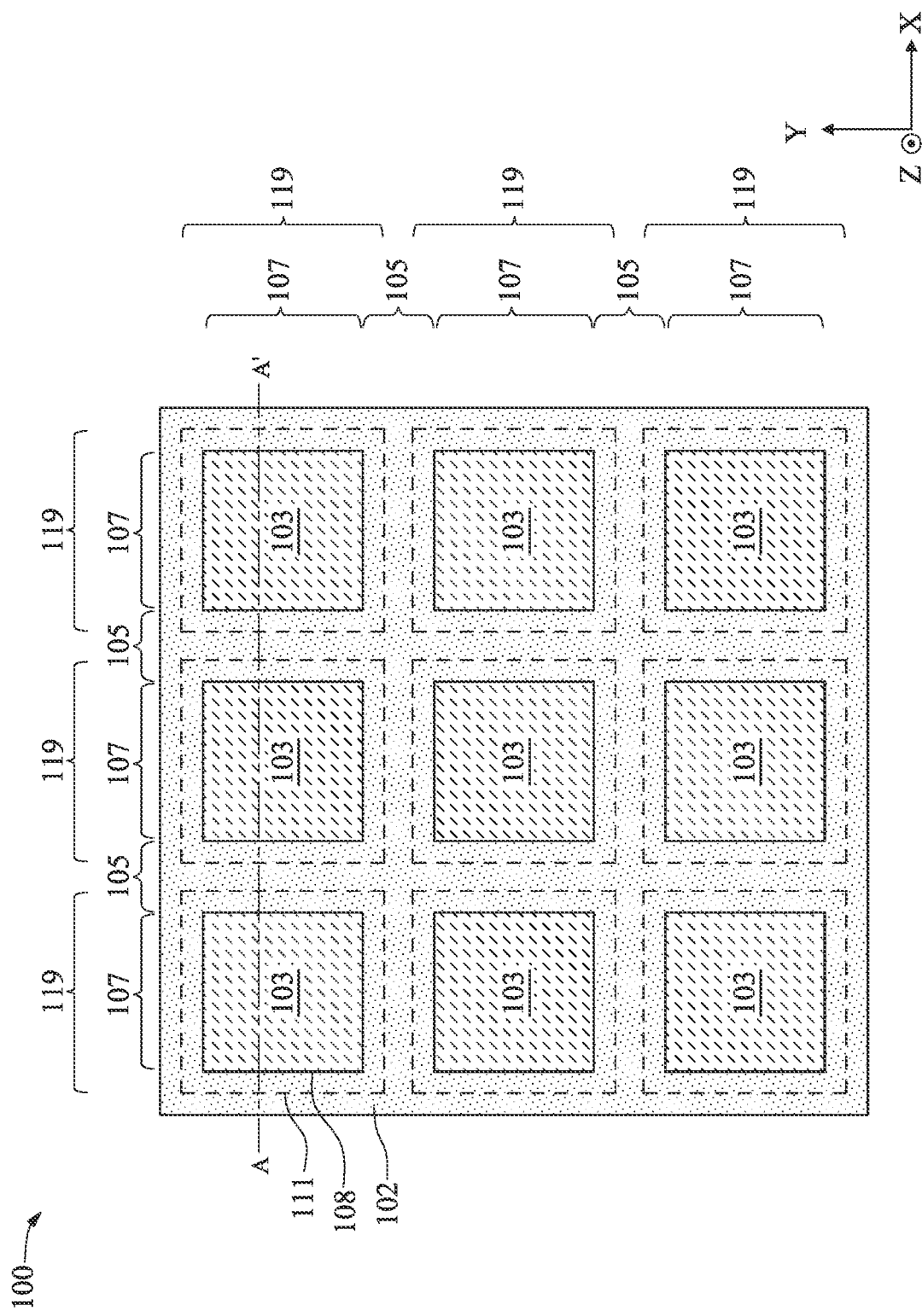
FIG. 1A is a schematic diagram illustrating a top view of a layout of an example semiconductor wafer in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Modern integrated circuits (ICs) are made of millions of electronic devices such as transistors and capacitors. These electronic devices are initially isolated from each other, but are later interconnected together through routing resources using back-end-of-line (BEOL) processes to form functional circuits. Typical interconnect structures include lateral ones, such as metal lines (wirings), and vertical ones, such as vias and contacts. On top of the interconnect structures, bond pads are formed and exposed on the surface of the respective (semiconductor) die. Electrical connections are made through bond pads to connect the die to a package substrate or another die. Bond pads can be used for wire bonding or flip-die bonding. Flip-die packaging utilizes bumps to establish electrical contact between a die's input/output (I/O) pads and the substrate or lead frame of the package. Wafer level die scale packaging (WLCSP) is currently widely used for its low cost and relatively simple processes, and ball placement or ball drop process is utilized in the WLCSP technology.

As such, dozens or hundreds of ICs can be fabricated on a single semiconductor wafer. These individual ICs are sometimes referred to as individual "dies." The individual dies are typically singulated or separated using a singulation process. One commonly used singulation process is performed by sawing the individual dies along scribe lines. The sawing can be implemented as mechanical sawing or laser sawing. After the singulation process, each die can be packaged and used independently.

A typical width of a scribe line is about 60 µm. The chip area under the scribe line is typically wasted. For dies fabricated using more advanced technology nodes (e.g., N3), the wasted chip area becomes relatively larger as the size of each die shrinks. Moreover, dies may be damaged during the mechanical sawing or laser sawing process. Finally, backside grinding is needed for mechanical sawing or laser sawing. Backside grinding introduces extra process flow complexity and additional cost.

The present disclosure provides techniques to address the above-mentioned challenges. In accordance with some aspects of the disclosure, a novel method for wafer-level die singulation using buried sacrificial layer is provided. According to some embodiments, a method includes fabricating multiple buried sacrificial structures embedded in a wafer substrate. Then, individual dies are formed respectively on the buried sacrificial structures, such that each buried sacrificial structure surrounds the die substrate of each individual die. The dies are subsequently separated from the wafer and singulated by removing the buried sacrificial structures, for example, using etching processes.

Unlike mechanical sawing or laser sawing, no scribe line is needed to separate individual dies, according to the present disclosure. Therefore, the chip area usage is improved, and potential damage caused by mechanical sawing or laser sawing can be avoided. In one example, the space between two neighboring dies is from 0.2 µm to 1 µm, as compared to a scribe line having a width about 60 µm. In addition, ultra-small thickness of the individual die can be achieved. In one example, the die fabricated has a thickness from 2 µm to 200 µm. Further, the individual dies may not be restricted in shape and two-dimensional configuration, and non-standard or irregularly-shaped dies may be densely packed in the horizontal plane of the wafer, which may further increase design flexibility, boost wafer area usage, and improve die productivity. Moreover, each singulated die obtained by etching off the buried sacrificial structure may have a smooth exterior surface with low roughness, as compared with the dies singulated by mechanical cutting process such as sawing.

Example Semiconductor Die and Semiconductor Wafer

Figure 1B:
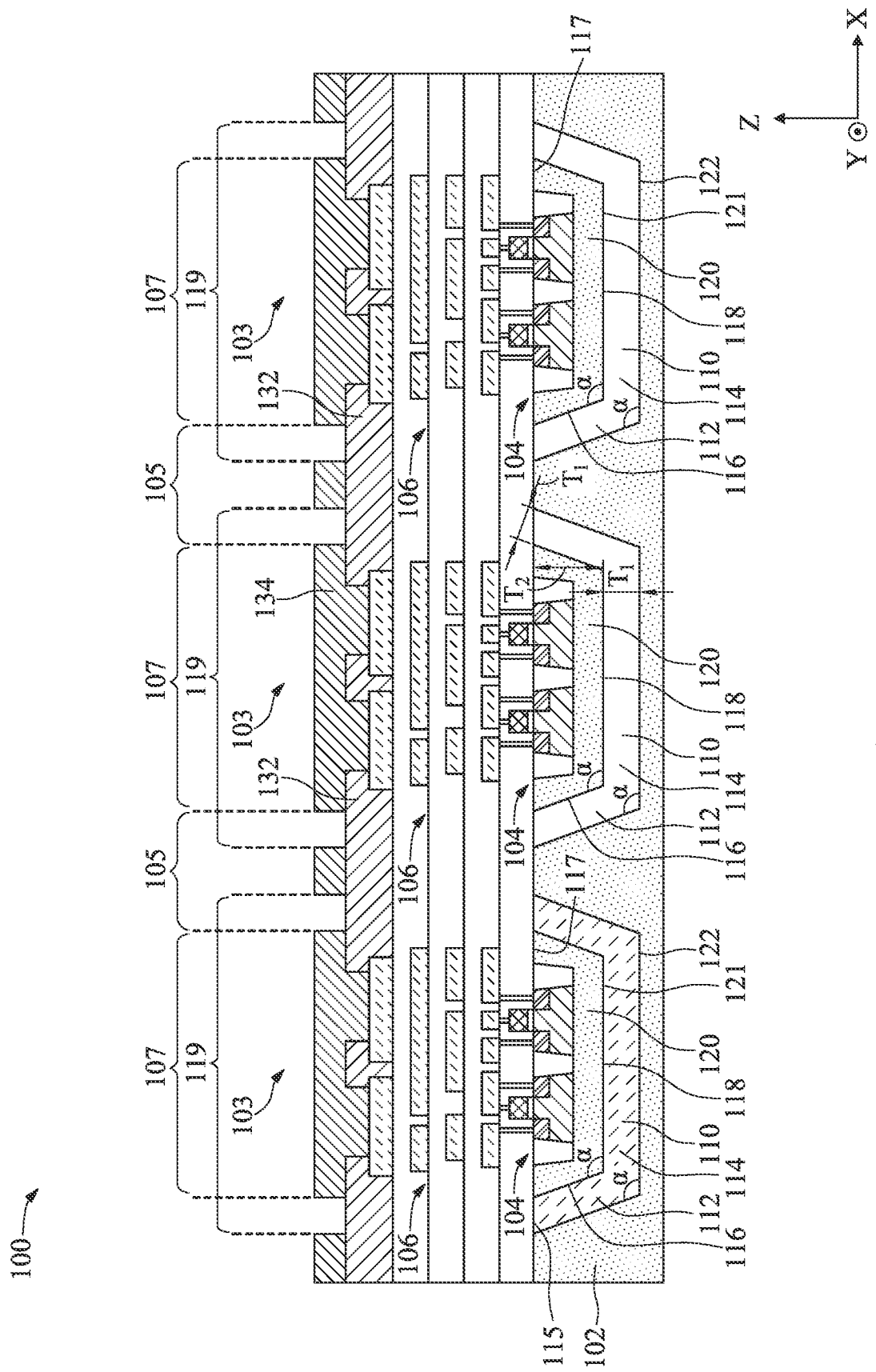
FIG. 1B is a schematic diagram illustrating a cross-sectional view of the example semiconductor wafer of FIG. 1A along an imaginary line A-A' in accordance with some embodiments.

FIG. 1A is a schematic diagram illustrating a top view of an example semiconductor wafer 100 in accordance with some embodiments. FIG. 1B is a schematic diagram illustrating a cross-sectional view of the example semiconductor wafer 100 of FIG. 1A along an imaginary line A-A'. In the illustrated example, the semiconductor wafer 100 (hereinafter "wafer") includes, among other components, a wafer substrate 102, multiple semiconductor dies 103 (hereinafter "dies"), and multiple buried sacrificial structures 110 (sometimes also referred to as "buried sacrificial layers" or "embedded sacrificial structures" or the like) disposed between the wafer substrate 102 and each of the dies 103.

As shown in FIG. 1A, the wafer 100 has multiple distinct die regions 107 separated and isolated by a die spacing region 105. Each die region 107 may have a standard shape or outline such as square or rectangle for purposes of simplicity. However, other shapes such as non-standard or irregular shape (e.g., pentagon, hexagon, cross-shape, etc.) may also be possible in alternative embodiments. Each die region 107 has a boundary 108, and each die 103 is disposed in the corresponding die region 107 within the boundary 108. The multiple dies 103 may be arranged in a pattern such as rows and columns. The multiple dies 103 may be densely packed such that the die spacing region 105 has a substantially smaller dimension as compared with the die region 107. The number of dies 103 included in the semiconductor wafer 100 may vary depending on the size of the dies and the size of the wafer substrate 102. The dies 103 are arranged apart from each other by the die spacing region 105. According to the present disclosure, the horizontal dimension of the die spacing region 105 (i.e., the distance between two adjacent dies 103, or the distance between an edge of the wafer substrate 102 and a die 103 close to the edge) may be less than 100 µm, less than 60 µm, less than 40 µm, less than 20 µm, less than 10 µm, less than 5 µm, or less than 2 µm.

In some embodiments, the wafer substrate is a single crystalline semiconductor material such as, but not limited to, at least one of Si, SiC, Ge, SiGe, InGaAs, GaAs, InSb, GaP, GaSb, InAlAs, GaSbP, GaAsSb, or InP, a silicon-on-insulator (SOI) structure. In some embodiments, each die 103 may include a logic die such as a central processing unit (CPU) die, a graphic processing unit (GPU) die, a mobile application die, or the like.

As shown in FIG. 1B, each die 103 includes a die substrate 120 disposed on the corresponding buried sacrificial structure 110, at least one integrated circuit (IC) device 104, a multi-layer interconnect (MLI) structure 106 (also referred to as "interconnect structure"). The IC device 104 may be one or more active or passive devices such as transistors, diodes, resistors, capacitors. The MLI structure 106 is disposed on and electrically connected to the IC device 104. The IC device 104 is disposed in the die substrate 120. The MLI structure is configured to electrically connect the IC device 104 to another component internal or external to the die 103.

The MLI structure 106 is a set of metallization layers (sometimes also referred to as "metal layers") that are added on one side of a substrate. The metallization layers are patterned to form a complex network of interconnects that connect the different components together. Each metallization layer is formed in a corresponding dielectric layer and includes multiple horizontal metal features (i.e., metal lines) and vertical metal features (i.e., metal vias) formed in the corresponding dielectric layer.

In some embodiments, multiple passivation layers (e.g., the first passivation layer 132 and the second passivation layer 134) are sequentially disposed on a topmost metallization layer of the MLI structure 106. In some embodiments, the passivation layers are formed of a dielectric material, such as undoped silicate glass (USG), silicon nitride, silicon oxide, silicon oxynitride, or a non-porous material by any suitable method, such as CVD, PVD, or the like. In some embodiments, an interlayer dielectric (ILD) structure (not shown) is disposed between the MLI structure 106 and the IC device 104, and a conductive feature (not shown) may be disposed in the ILD structure to electrically interconnect the IC device 104 and the MLI structure 106.

In some embodiments, the die substrate 120 and the wafer substrate 102 may be the same with respect to composition (i.e., composed of the same material, such as silicon). Alternatively, the die substrate 120 and the wafer substrate 102 may be composed of different materials. In some embodiments, the wafer substrate 102 includes Si, and the die substrate 120 includes SiC.

In the illustrated example, each of the buried sacrificial structures 110 is buried or embedded in the wafer substrate 102 and disposed between the die substrate 120 and the wafer substrate 102. As shown in FIG. 1A, the buried sacrificial structure 110 is located in a sacrificial region 119 defined by a boundary 111 (in broken lines). The sacrificial region 119 overlaps and encompasses the die region 107 in the X-Y plane and is substantially aligned and centered with the die region 107 in the X-Y plane. The boundary 111 is substantially aligned or in parallel with the boundary 108 of the die region 107. A portion of the sacrificial region 119 (i.e., between the boundary 111 and the boundary 108) is located in the die spacing region 105 and surrounding the die region 107.

As shown in FIG. 1B, each of the buried sacrificial structures 110 further includes a side portion 112 and a bottom portion 114. The side portion 112 is circumferentially connected to the bottom portion 114. The side portion 112 is substantially located in the portion of the sacrificial region 119 between the boundary 111 and the boundary 108. The bottom portion 114 is located in the portion of the sacrificial region 119 that is substantially overlapped with the die region 107. An angle (a) formed between the side portion 112 and a bottom portion 114 is at least 85 degrees. In some embodiments, the angle (a) is at least 90 degrees, at least 100 degrees, at least 110 degrees, or at least 120 degrees. The side portion 112 of the buried sacrificial structure 110 is substantially located in the die spacing region 105 and surrounding the IC device 104. The die substrate 120 of each die 103 is substantially overlaid on and vertically aligned with the bottom portion 114 of the buried sacrificial structure 110. The side portion 112 has a top surface 115 co-planar with the top surface 117 of the die substrate 120. In some embodiments, the buried sacrificial structure 110 is composed of silicon oxide ($SiO_2$). In alternative embodiments, the buried sacrificial structure 110 may include a metal, a polymer, a polysilicon, an oxide, or a combination thereof.

The die substrate 120 is disposed on and surrounded by the corresponding buried sacrificial structure 110. Each die substrate 120 extends vertically from a top surface 117 to a bottom surface 118 and further includes a sidewall 116 circumferentially connecting the top surface 117 and the bottom surface 118. The sidewall 116 is in contact and substantially aligned with the side portion 112 of the buried sacrificial structure 110, and the bottom surface 118 is in contact and substantially aligned with the bottom portion 114 of the buried sacrificial structure 110. Accordingly, the angle formed between the bottom surface 118 and the sidewall 116 is substantially the same with the angle (a) formed between the side portion 112 and a bottom portion 114 of the buried sacrificial structure 110.

As shown in FIG. 1B, the side portion 112 and the bottom portion 114 of the buried sacrificial structures 110 may have a critical dimension or thickness ($T_1$), measured by a distance from a top surface 121 to a bottom surface 122 of the side portion 112 and the bottom portion 114. $T_1$ also reflects the distance between the boundary 108 and the boundary 111 as shown in FIG. 1A. In some embodiments, $T_1$ is from about 0.2 μm to about 20 μm, from about 0.2 μm to about 10 μm, from about 0.2 μm to about 5 μm, or from about 0.2 μm to about 1 μm. The die substrate 120 may have a thickness ($T_2$) from about 1 μm to about 500 μm, from 2 μm to about 200 μm, or from 2 μm to 100 μm.

Figure 2A:
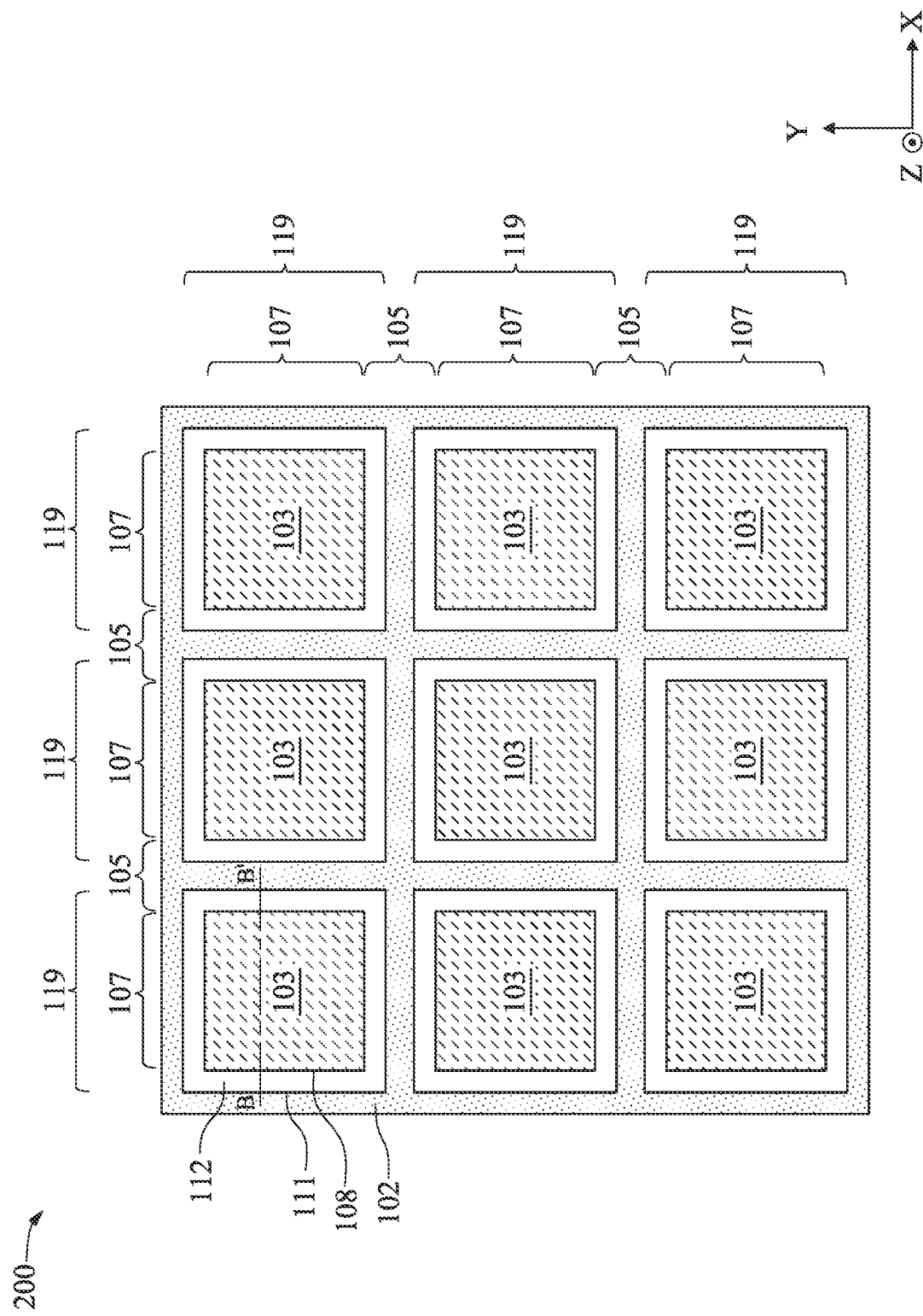
FIG. 2A is a schematic diagram illustrating a top view of a layout of an example semiconductor wafer in accordance with some embodiments.
Figure 2B:
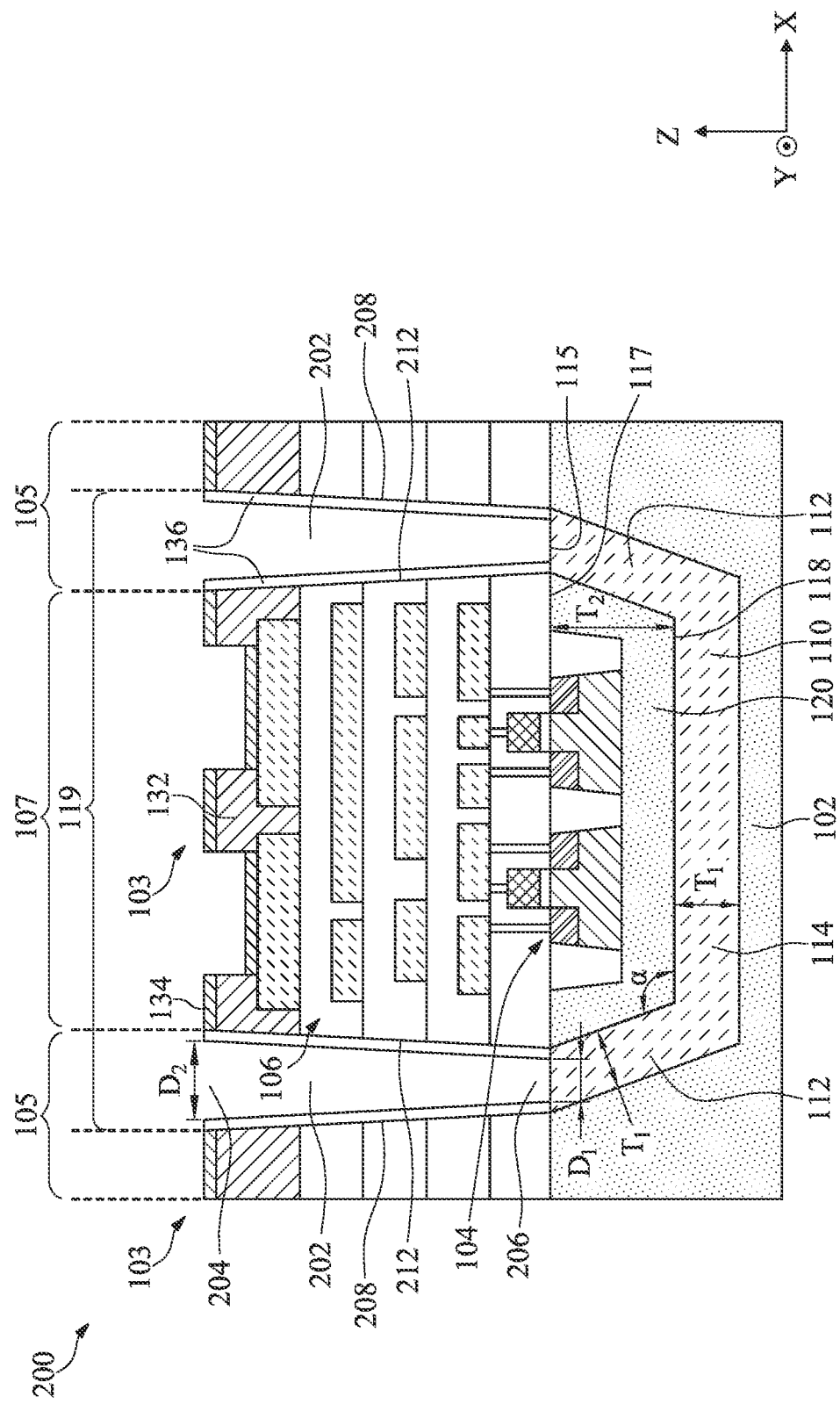
FIG. 2B is a schematic diagram illustrating a cross-sectional view of a portion of the example semiconductor wafer of FIG. 2A along an imaginary line B-B' in accordance with some embodiments.

FIG. 2A is a schematic diagram illustrating a top view of an example semiconductor wafer 200 in accordance with some embodiments. FIG. 2B is a schematic diagram illustrating a cross-sectional view of a portion of the example semiconductor wafer 200 of FIG. 2A along the line B-B'.

The wafer 200 is a close variation of the semiconductor wafer 100 of FIGS. 1A-1B. In the illustrated example, the wafer 200 includes, among other components, a wafer substrate 102, multiple dies 103, and multiple buried sacrificial structures 110 disposed between the wafer substrate 102 and each of the dies 103. The dies 103 are separated from each other by a die spacing region 105. The wafer 200 includes multiple dicing trenches 202 (sometimes also referred to as "dicing channels" or "channels") corresponding to the multiple dies 103. Each dicing trench 202 is located in the die spacing region 105 surrounding the corresponding die 103, or more particularly, the portion of the sacrificial region 119 between the boundary 108 and the boundary 111. The dicing trench 202 may be formed through the MLI structure 106 and circumferentially connected to the side portion 112 of the corresponding buried sacrificial structures 110, such that a top surface of the side portion 112 is exposed to the dicing trench 202.

In the illustrated example, each dicing trench 202 is disposed in the overlapped portion of the die spacing region 105 and the sacrificial region 119 surrounding a periphery of the die region 107. As shown in FIG. 2B, each dicing trench 202 extends vertically from a top open end 204 to a bottom open end 206 and extends horizontally from an inner sidewall 212 to an outer sidewall 208. The bottom open end 206 is connected to a top surface of the side portion 112 of the buried sacrificial structure 110 and has a horizontal dimension ($D_1$). The top open end 204 has a horizontal dimension ($D_2$). In some embodiments, $D_2$ is substantially the same as $D_1$. In other embodiments, $D_2$ is larger than $D_1$, such that the inner sidewall 212 and the outer sidewall 208 are sloped. In some embodiments, the $D_1$ is larger than or substantially the same as $T_1$, such that the top surface of the side portion 112 of the buried sacrificial structure 110 is substantially exposed to the dicing trench 202.

In some embodiments, the wafer 200 further includes a third passivation layer 136 disposed on the second passivation layer 134 and on both the inner sidewall 212 and the outer sidewall 208 of the dicing trench 202. The third passivation layer 136 may serve as a protection layer to protect the inner sidewall 212 during the subsequent fabrication process (e.g., etching). After a singulation process, the dies 103 are separated from the wafer 200, and the inner sidewall 212 becomes the sidewall of the individual die 103. Thus, the third passivation layer may further protect the individual die 103.

It should be understood that the buried sacrificial structure 110 may be entirely or substantially removed to form a subsurface void (e.g., the subsurface void 742 of FIG. 7P) in the same place. The subsurface void may take the shape of the buried sacrificial structure 110 and thus circumferentially connected to the dicing trench 202, forming a continuous dicing void (e.g., the dicing void 744 of FIG. 7P) surrounding and partially enclosing the die 103. The dicing void may be used to separate the die 103 from the wafer substrate 102 in the singulation process. More examples of the removal of buried sacrificial structure, formation of subsurface void and dicing void, and singulation process for fabricating individual dies will be described in detail below with references to FIGS. 7A-7R.

Figure 3A:
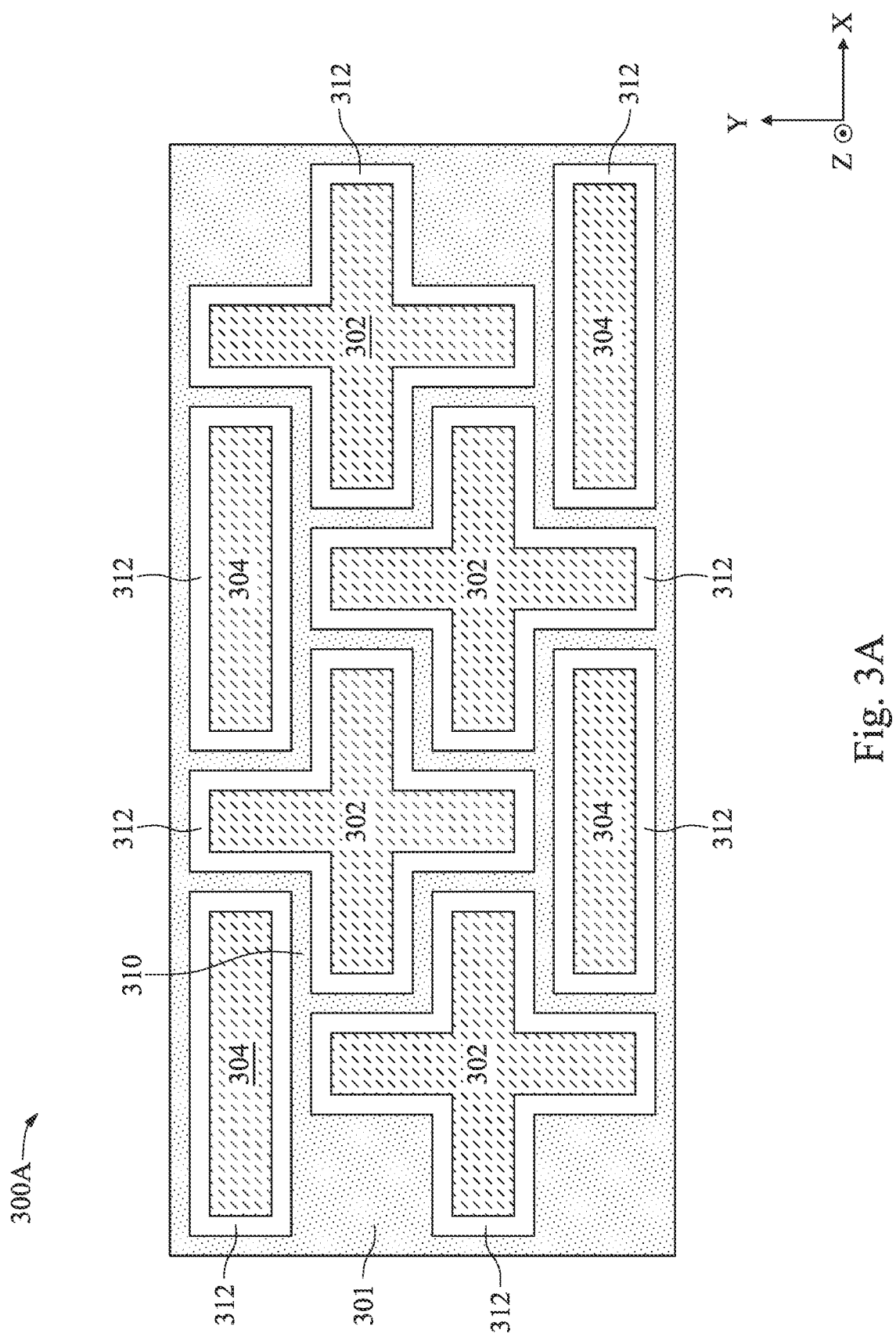
FIG. 3A is a schematic diagram illustrating a top view of a layout of another example wafer, in accordance with some embodiments.
Figure 3B:
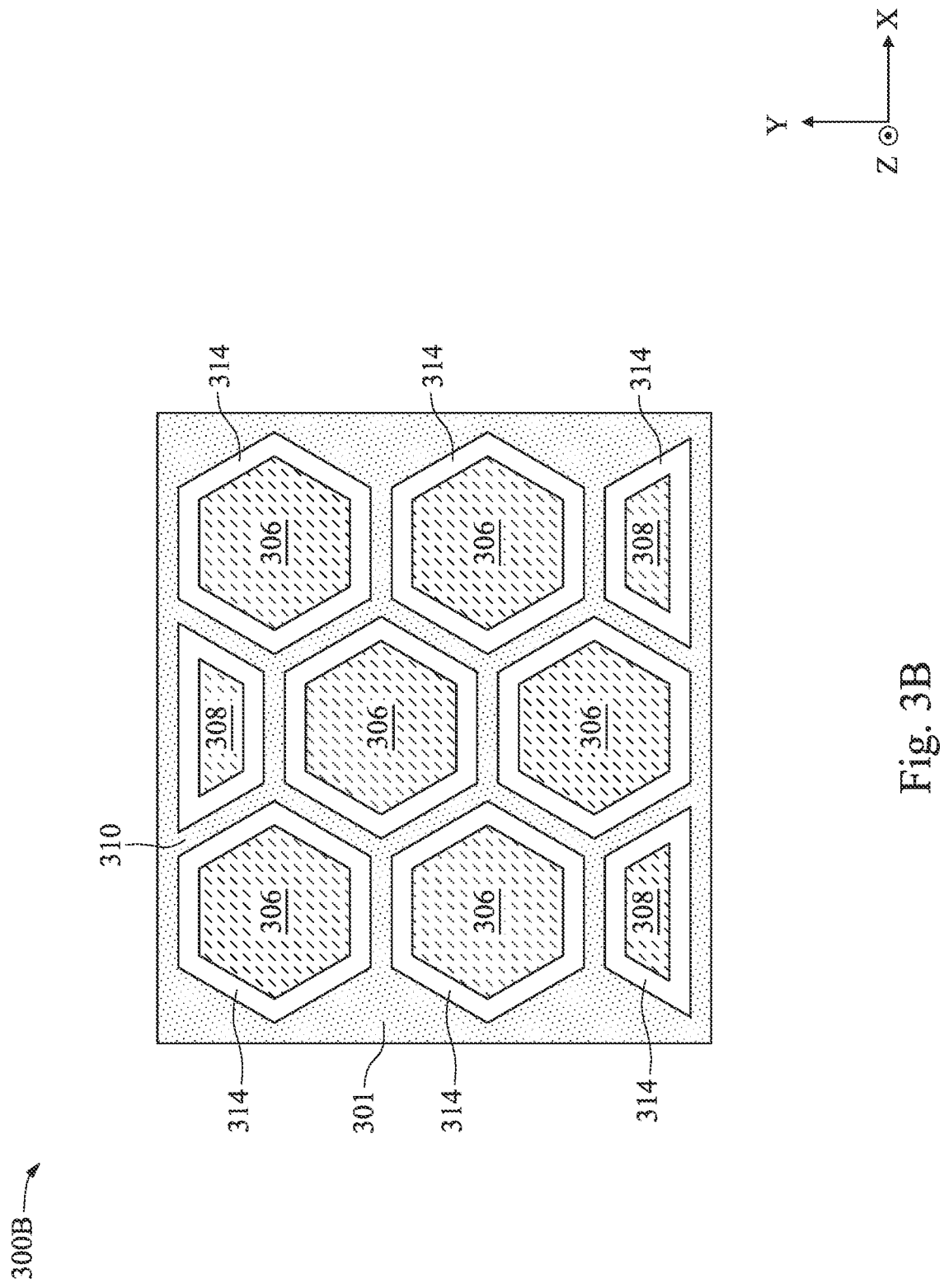
FIG. 3B is a schematic diagram illustrating a top view of a layout of another example wafer, in accordance with some embodiments.

FIGS. 3A-3B are schematic diagrams respectively illustrating a top view of a layout of additional example wafers 300A and 300B, in accordance with some embodiments. The wafers 300A and 300B are close variations of the wafers 100 and 200 and demonstrate various 2-dimensional (2D) shapes and patterns of the dies that are densely packed in the horizontal plane of the wafer. In the illustrated example of FIG. 3A, the wafer 300A includes multiples dies 302 and 304 in various shapes as well as a buried sacrificial structure 312 for each of the dies 302 and 304. The die 302 has a non-standard shape (i.e., a cross-shaped) and the die 304 has a rectangular shape. The dies 302 and 304 are apart from each other by a die spacing region 310, the buried sacrificial structure 312 is disposed between the wafer substrate 301 and each of the dies 302 and 304, and the side portion of the buried sacrificial structure 312 is located in the die spacing region 310 surrounding each one of the dies 302 and 304. These dies 302 and 304 can be arranged in a complementary manner in the X-Y plane.

In the illustrated example of FIG. 3B, the wafer 300B similarly includes multiple dies 306 and 308 in various shapes and a buried sacrificial structure 314 for each of the dies 306 and 308. The die 306 has a hexagon shape and the die 308 has a trapezoid shape (i.e., half of a hexagon). The dies 306 and 308 are apart from each other by a die spacing region 310, and the buried sacrificial structure 314 is disposed between the wafer substrate 301 and each of the dies 306 and 308, and the side portion of the buried sacrificial structure is located in the die spacing region 310 surrounding each of the dies 306 and 308. The dies 306 and 308 may also be arranged in a highly complementary manner on the wafer 300B. Because these non-standard and irregularly-shaped dies can be separated and singulated from the wafer using the buried sacrificial structure (i.e., 312 and 314) and without the use of a scribe line, these non-standard or irregularly-shaped dies can be packed closely together in the X-Y plane, minimizing the wasted area of the wafer. This enables a higher number of dies to be accommodated on the wafer, resulting in increased productivity and improved yield.

Example Fabrication Process Flow

Figure 4:
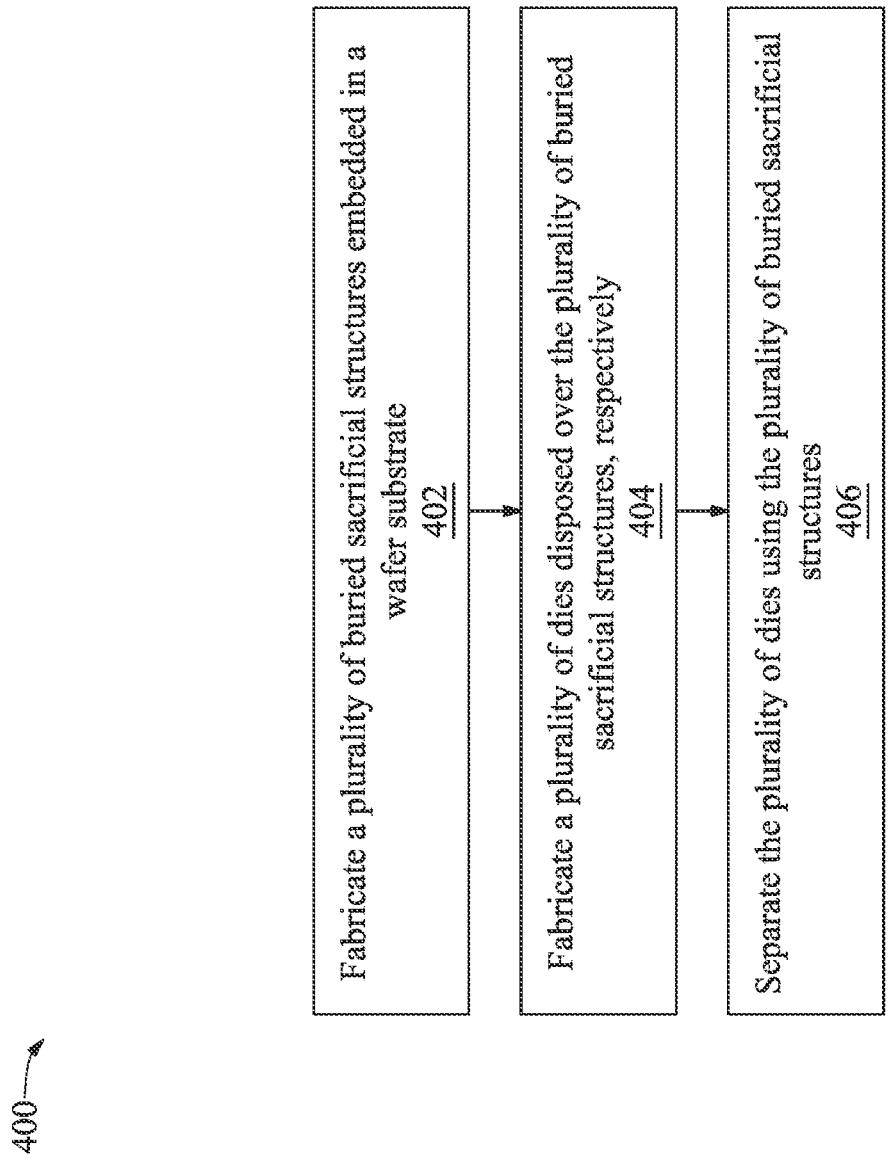
FIG. 4 is a flowchart diagram illustrating an example method for wafer-level die singulation of a wafer in accordance with some embodiments.
Figure 5:
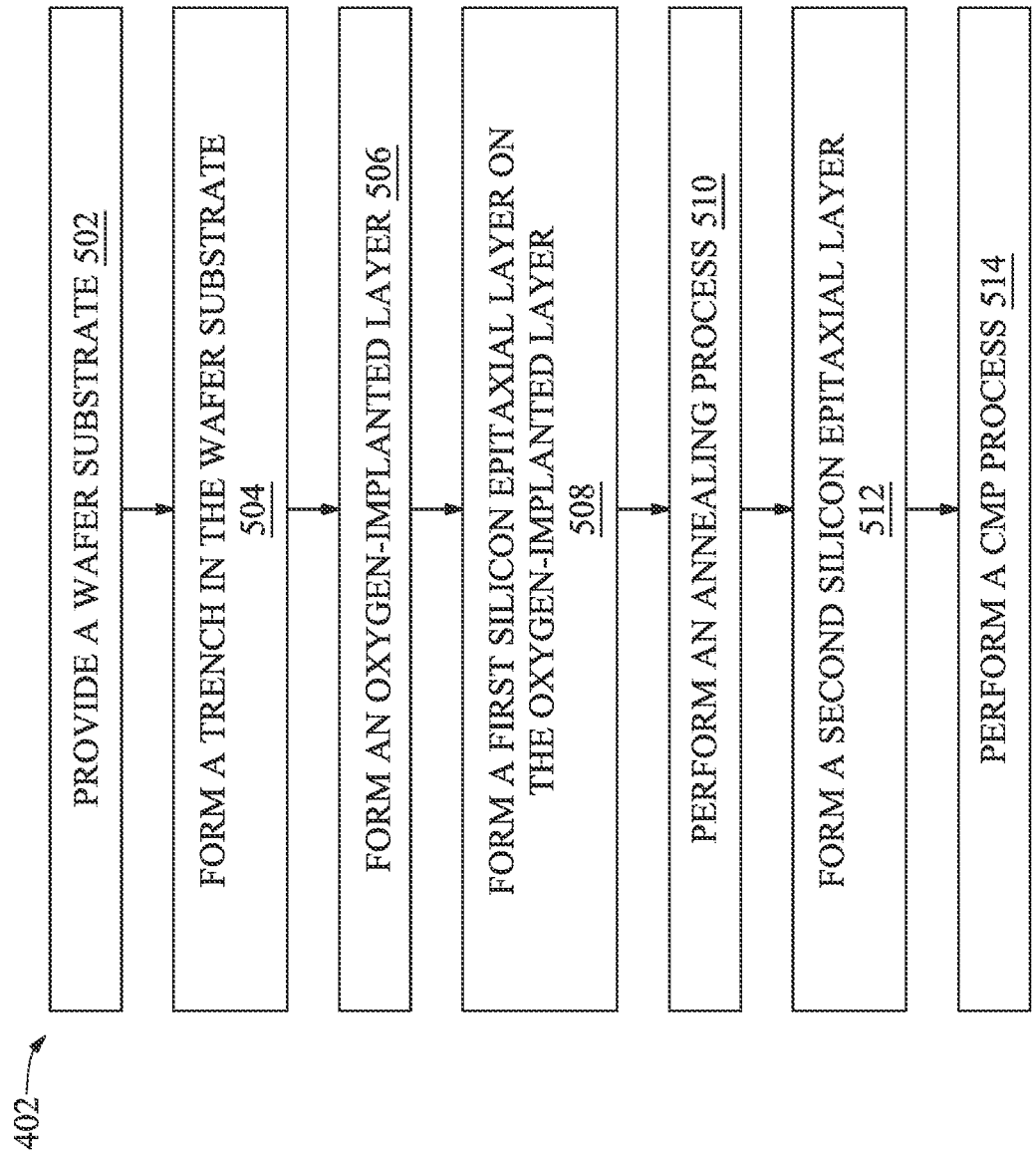
FIG. 5 is a flowchart diagram illustrating an example operation shown in FIG. 4 in accordance with some embodiments.
Figure 6:
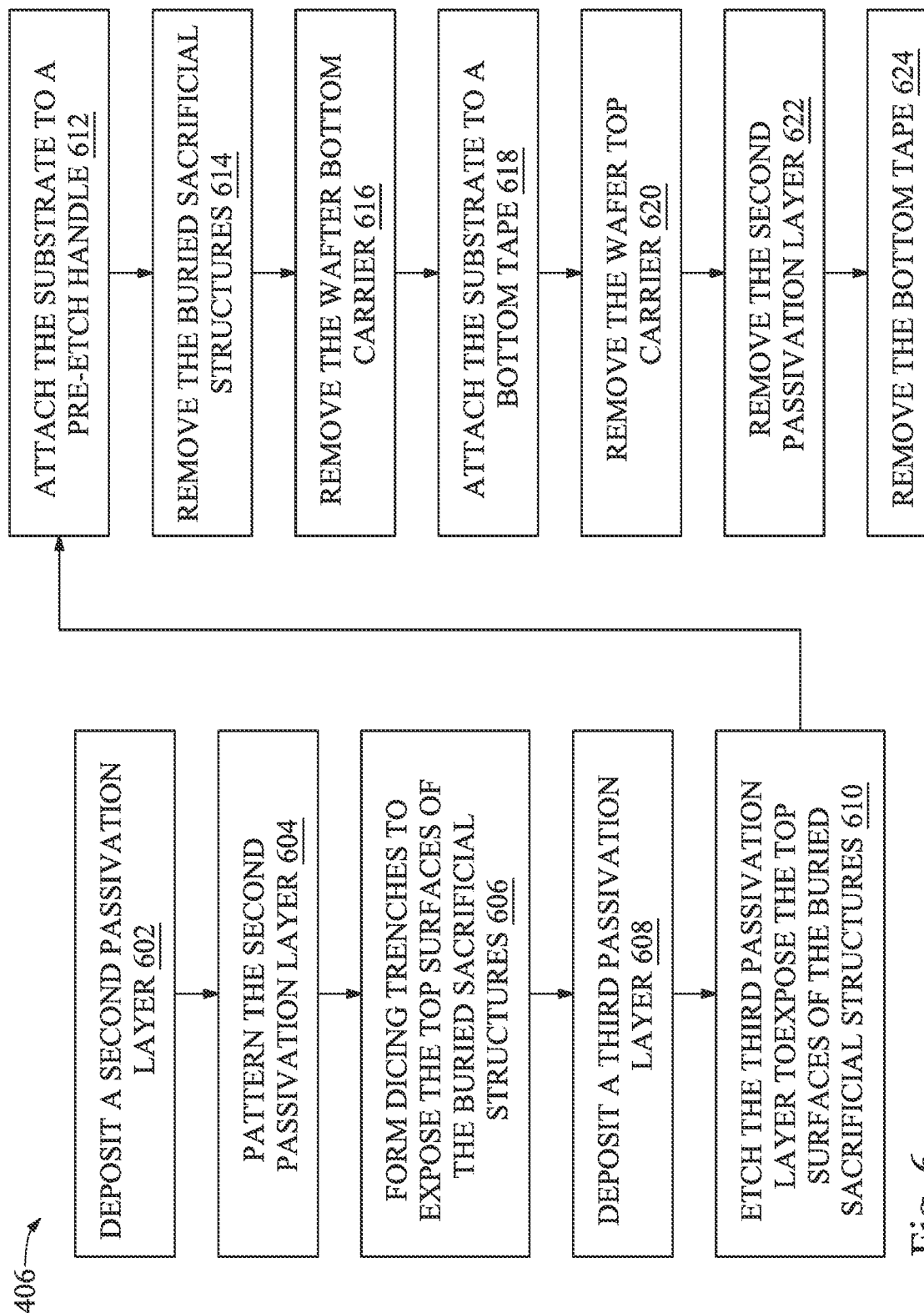
FIG. 6 is a flowchart diagram illustrating another example operation shown in FIG. 4 in accordance with some embodiments.
Figure 7A:
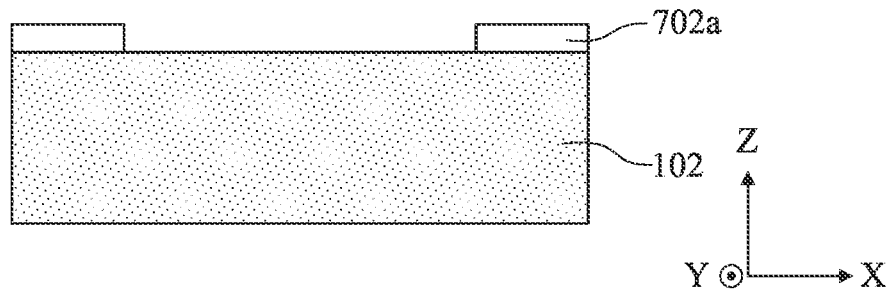
FIGS. 7A-7R are cross-sectional diagrams illustrating a wafer, at various stages, fabricated using the example method shown in FIGS. 4-6, in accordance with some embodiments.

FIG. 4 is a flowchart diagram illustrating an example method 400 for wafer-level die singulation of a wafer 700 in accordance with some embodiments. FIG. 5 is a flowchart diagram illustrating an example operation 402 shown in FIG. 4 in accordance with some embodiments. FIG. 6 is a flowchart diagram illustrating an example operation 406 in accordance with some embodiments. FIGS. 7A-7Q are cross-sectional diagrams illustrating the wafer 700, at various stages, fabricated using the example method 400 shown in FIG. 4 in accordance with some embodiments.

In the example shown in FIG. 4, the example method 400 includes operations 402, 404, and 406. Additional operations may be performed. At operation 402, multiple buried sacrificial structures are fabricated within a substrate of a wafer.

In the example shown in FIG. 5, operation 402 includes operations 502, 504, 506, 508, 510, 512, and 514. Additional operations may be performed. Also, it should be understood that the sequence of the various operations discussed with reference to FIG. 5 is provided for illustrative purposes, and as such, other embodiments may utilize different sequences. These various sequences of operations are to be included within the scope of embodiments.

At operation 502, a semiconductor substrate (i.e., a wafer substrate) is provided. As mentioned above, the semiconductor substrate may be a silicon substrate. It should be understood that other types of substrate may be employed as well in other embodiments.

At operation 504, a trench is formed in the semiconductor substrate. In one embodiment, the semiconductor substrate is selectively etched to form the trench. In one example, the trench is etched by etching the area of the semiconductor substrate that is left exposed by the first mask pattern. In one embodiment, the first mask pattern is a photoresist mask pattern. In another embodiment, the first mask pattern is a hard mask pattern, and the hard mask pattern may include silicon oxide, silicon nitride, silicon oxynitride, or combinations thereof. In one embodiment, the semiconductor substrate is etched using wet etching. In another embodiment, the semiconductor substrate is etched using dry etching. In one example, the semiconductor substrate is etched using plasma etching.

In the example shown in FIG. 7A, the wafer substrate 102 is a portion of a wafer 700 and has an area that is left exposed by the first mask pattern 702a. The geometry of the area that is left exposed corresponds to the trench to be formed.

Figure 7B:
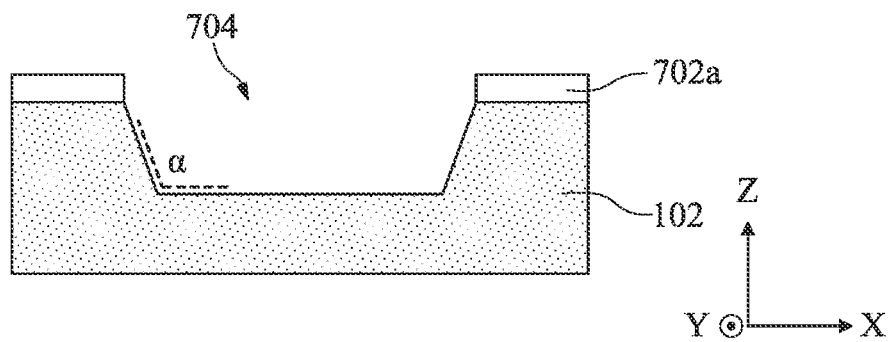
Figure 7C:
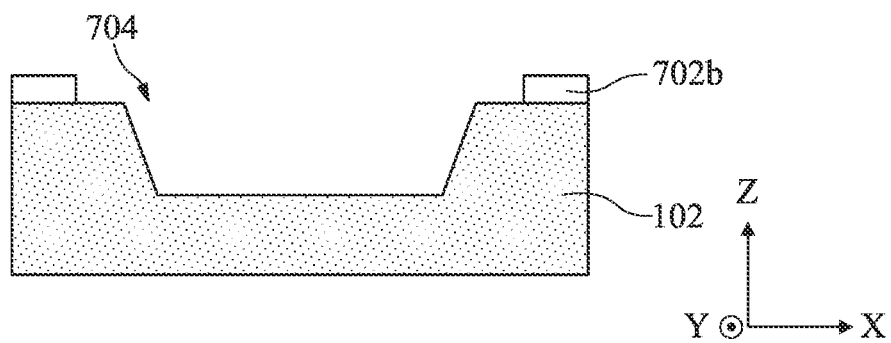

In the example shown in FIG. 7B, the trench 704 is formed by etching the wafer substrate 102. After the wafer substrate 102 is etched, the trench 704 has a bottom and a sidewall. The bottom and sidewall define the angle α shown in FIG. 1A. In some embodiments, the angle α is at least 85 degrees. In one example, the angle α is 90 degrees. In another example, the angle α is 100 degrees. In yet another example, the angle α is 110 degrees. In still another example, the angle α is 120 degrees.

At operation 506, an oxygen-implanted layer is formed. In one embodiment, an opening is defined using the second mask pattern 702b, which has a larger opening than the first mask pattern used at operation 504. The difference between these two mask patterns corresponds to the geometry (in the X-Y plane) of the buried sacrificial structure 110 shown in FIG. 1B. In one embodiment, the second mask pattern is a photoresist mask pattern. In another embodiment, the second mask pattern 702b is a hard mask pattern, and the hard mask pattern may include silicon oxide, silicon nitride, silicon oxynitride, or combinations thereof.

The area of the semiconductor substrate left exposed by the second mask pattern 702b is implanted with oxygen. As a result, oxygen is implanted into the semiconductor substrate below the surface of the bottom and sidewalls of the trench. Depending on the implant energy and duration, the thickness of the oxygen-implanted layer may be adjusted. The thickness of the oxygen-implanted layer is defined as a portion below the top surface with oxygen concentration above a predetermined amount. In one example, the oxygen concentration ranges from $5\times10^{15}$ cm$^{-2}$ to $5\times10^{18}$ cm$^{-2}$. It should be understood that other oxygen concentration values can be employed in other examples.

Figure 7D:
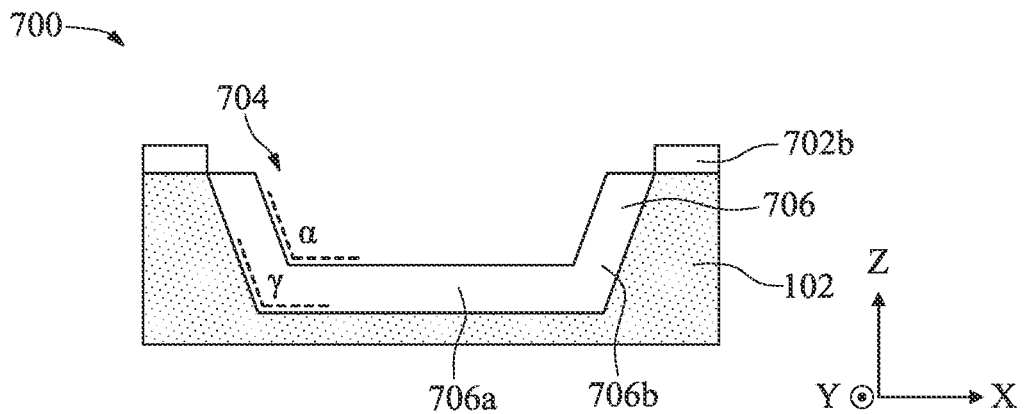

As shown in the example in FIG. 7D, the oxygen-implanted layer 706 is formed after operation 506. The oxygen-implanted layer 706 corresponds to the buried sacrificial structure 110 shown in FIG. 1B. The oxygen-implanted layer 706 has a bottom portion 706a and a sidewall portion 706b. The sidewall portion 706b is disposed on the sidewall portion of the trench 704. The sidewall portion 706b and the bottom portion 706a define the angle γ shown in FIG. 1B. In some embodiments, the angle γ is at least 85 degrees. In one example, the angle γ is 90 degrees. In another example, the angle γ is 100 degrees. In yet another example, the angle γ is 110 degrees. In still another example, the angle γ is 120 degrees. In some embodiments, the angle γ is substantially the same as the angle α.

At operation 508, a first silicon epitaxial layer is formed on the oxygen-implanted layer. In one embodiment, an opening is defined using the first mask pattern used at operation 504, which has a smaller opening than the second mask pattern 702b used at operation 506. The first silicon epitaxial layer is epitaxially grown on the oxygen-implanted layer. In some embodiments, the first silicon epitaxial layer is epitaxially grown using chemical vapor deposition (CVD)

techniques (e.g., metal-organic chemical vapor deposition (MOCVD), atmospheric-pressure CVD (APCVD), low-pressure CVD (LPCVD), ultra-high-vacuum CVD (UHVCVD)), molecular beam epitaxy (MBE), atomic layer deposition (ALD), other suitable techniques, or combinations thereof.

Figure 7E:
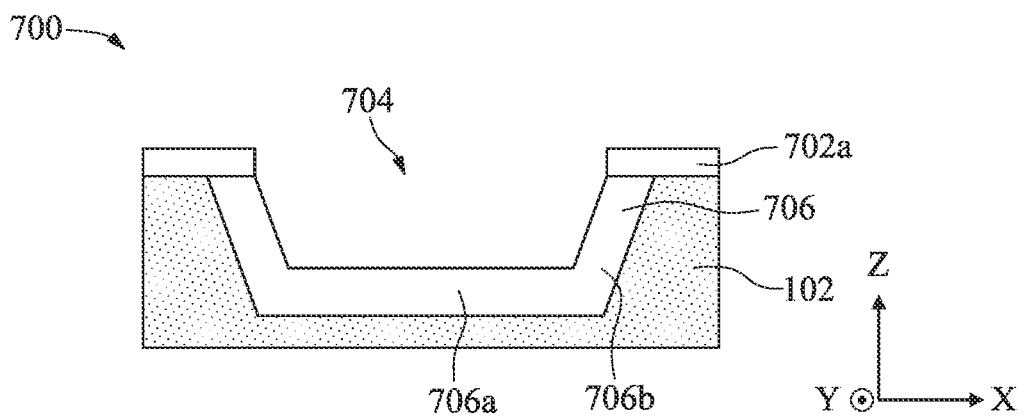

In the example shown in FIG. 7E, the first mask pattern 702a covers the top surface of the sidewall portion 706b of the oxygen-implanted layer 706, preventing the first silicon epitaxial layer from forming thereon.

Figure 7F:
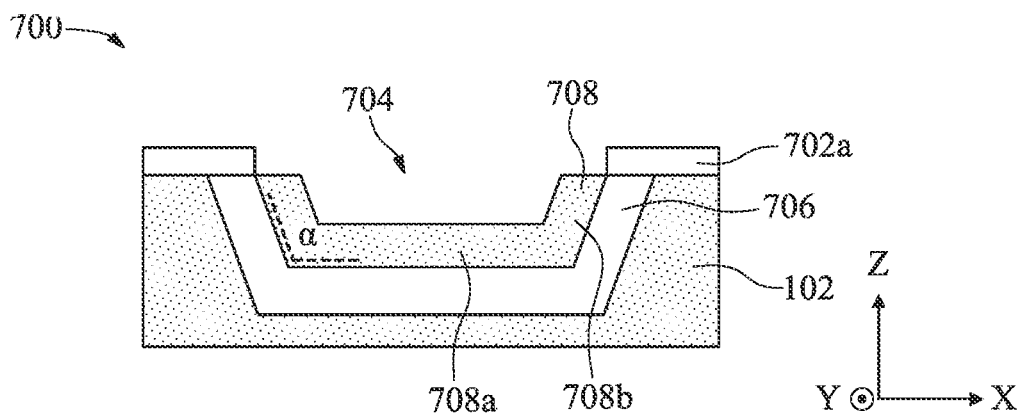

In the example shown in FIG. 7F, the first silicon epitaxial layer 708 is formed on the oxygen-implanted layer 706. The first silicon epitaxial layer 708 has a bottom portion 708a and the sidewall portion 708b. The sidewall portion 708b and the bottom portion 708a define the angle α shown in FIG. 1B. In some embodiments, the angle α is larger than 85 degrees. In one example, the angle α is 90 degrees. In another example, the angle α is 100 degrees. In yet another example, the angle α is 110 degrees. In still another example, the angle α is 120 degrees.

At operation 510, an annealing process is performed. In one implementation, the annealing process is a thermal annealing process. In one example, the temperature of the thermal annealing process ranges from 900° C. to 1100° C. After the annealing process, the oxygen in the oxygen-implanted layer, which is introduced at operation 506, reacts with the silicon in the oxygen-implanted layer to form silicon dioxide. As a result, the oxygen-implanted layer transforms into a silicon dioxide layer.

Figure 7G:
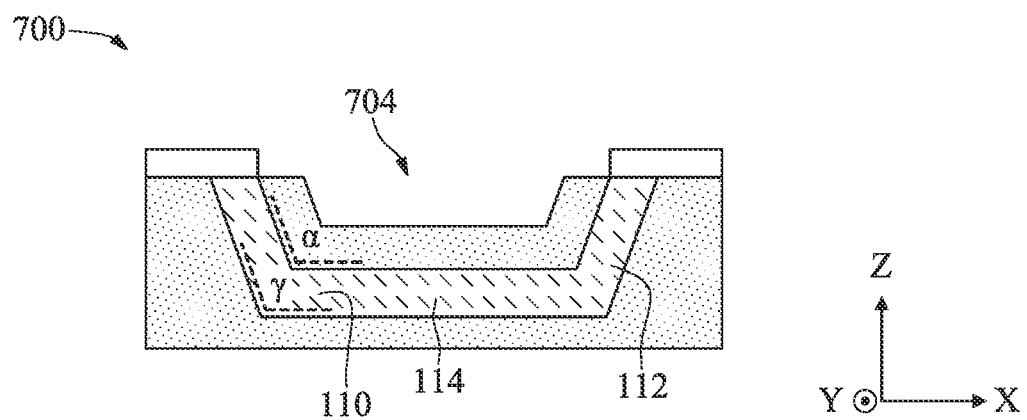

In the example shown in FIG. 7G, the oxygen-implanted layer 706 shown in FIG. 7F transforms into the buried sacrificial structure 110. The buried sacrificial structure 110 includes the bottom portion 114 and the side portion 112, respectively corresponding to the bottom portion 706a and the sidewall portion 706b of the oxygen-implanted layer 706.

At operation 512, a second silicon epitaxial layer is formed. The second silicon epitaxial layer is epitaxially grown on the first silicon epitaxial layer. In some implementations, the second silicon epitaxial layer is epitaxially grown using CVD techniques (e.g., MOCVD, APCVD, LPCVD, UHVCVD), MBE, ALD, other suitable techniques, or combinations thereof.

Figure 7H:
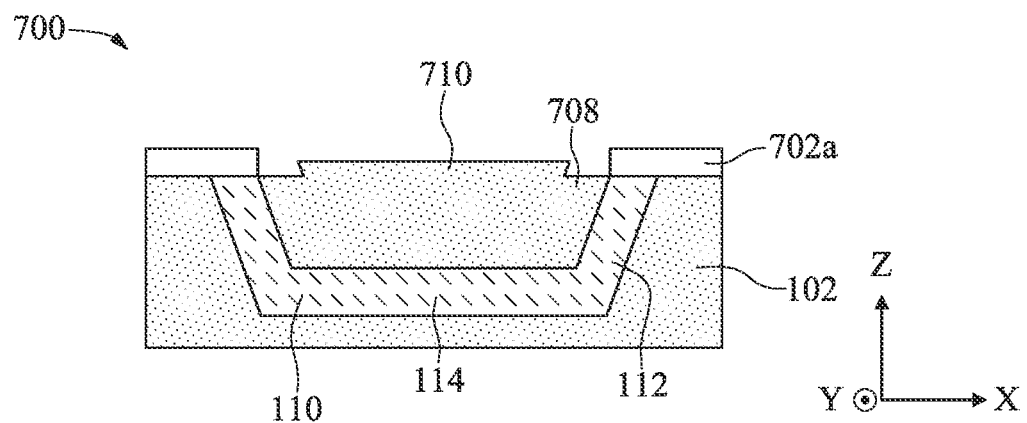

In the example shown in FIG. 7H, a second silicon epitaxial layer 710 is formed on the first silicon epitaxial layer 708 and fills the remainder of the trench 704 shown in FIG. 7G. The second silicon epitaxial layer 710 may, as shown in FIG. 7H, exceed the top surface of the first silicon epitaxial layer 708 in the Z-direction. The top surface of both the first silicon epitaxial layer 708 and the second silicon epitaxial layer 710 can be planarized in a subsequent planarization process, as will be discussed below.

At operation 514, a chemical-mechanical planarization (CMP) process is performed. The CMP process is performed on the top surface of the semiconductor substrate. After operation 514, the portion of the second silicon epitaxial layer that is outside the trench or above the top surface of the semiconductor substrate is removed.

Figure 7I:
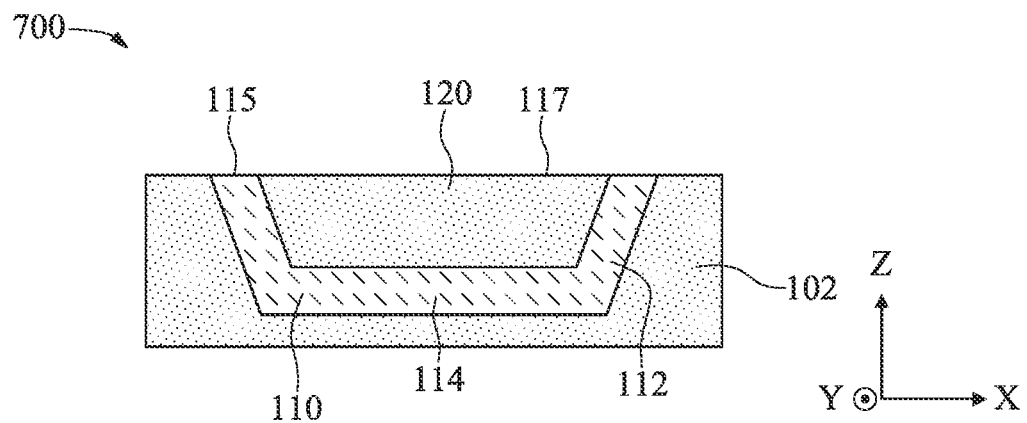

In the example shown in FIG. 7I, the top surface of the wafer substrate 102 is planarized. As such, a buried sacrificial structure 110 is formed in the wafer substrate 102. The first silicon epitaxial layer 708 and the second silicon epitaxial layer 710 together form the die substrate 120, which is partially enclosed and surrounded by the buried sacrificial structure 110. The top surface 117 of the die substrate 120 is co-planar with the top surface of the wafer substrate 102 and the top surface 115 of the side portion 112 of the buried sacrificial structure 110. In the horizontal directions, the side portion 112 of the buried sacrificial structure 110 encircles die substrate 120. Although only one buried sacrificial structure 110 is shown in FIG. 7I, it should be understood that multiple buried sacrificial structures 110 may be fabricated in the wafer substrate 102, and each buried sacrificial structure 110 may correspond to a to-be-formed die on the die substrate 120 and above the bottom portion 114 of the buried sacrificial structure 110.

Figure 7J:
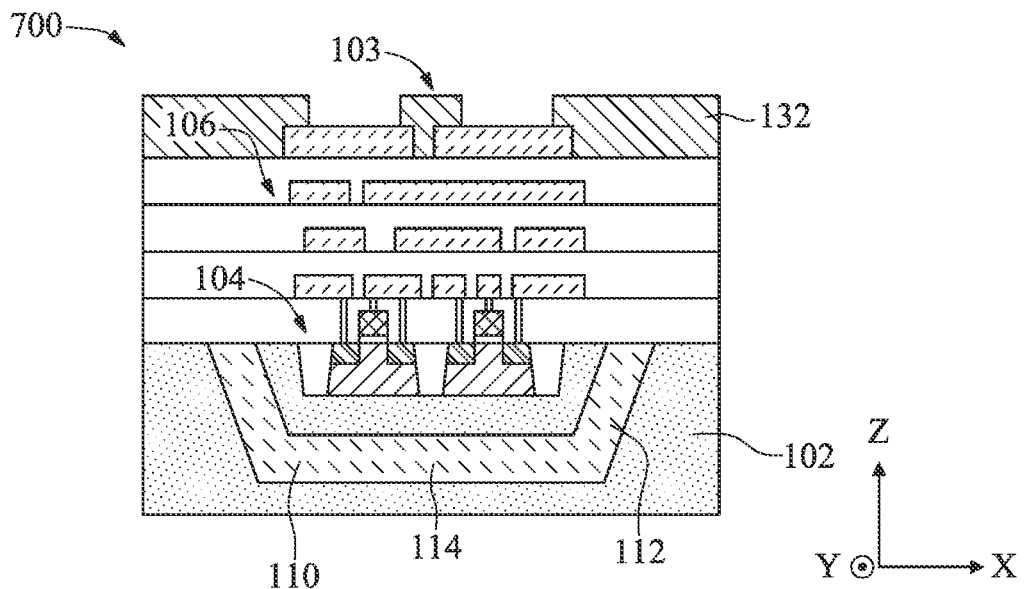

At operation 404 of FIG. 4, a plurality of dies are formed and disposed over the plurality of buried sacrificial structures, respectively. In the example shown in FIG. 7J, the die 103 is formed over each die substrate 120. In some embodiments, an IC device 104 is formed in the die substrate 120, and an MLI structure 106 is subsequently formed over the IC device. A first passivation layer 132 is formed on the topmost metallization layer of the MLI structure 106. The IC device 104, the MLI structure 106, and the first passivation layer 132 may be constituents of the die 103.

At operation 406 of FIG. 4, the plurality of dies are separated or singulated to form individual dies using the plurality of buried sacrificial structures. In the example shown in FIG. 6, operation 406 includes operations 602, 604, 606, 608, 610, 612, 614, 616, 618, 620, 622, and 624. Additional operations may be performed. Also, it should be understood that the sequence of the various operations discussed with reference to FIG. 6 is provided for illustrative purposes, and as such, other embodiments may utilize different sequences. These various sequences of operations are to be included within the scope of embodiments.

Figure 7K:
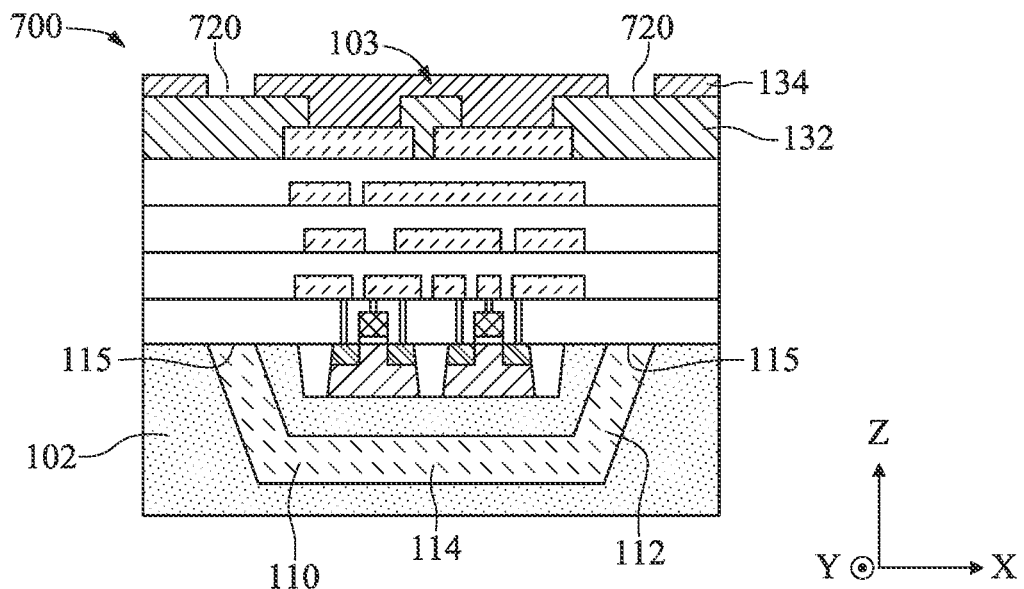

At operation 602, a second passivation layer is deposited. As shown in FIG. 7K, the second passivation layer 134 is formed on the first passivation layer 132 and covers the metal lines of the topmost metallization layer of the MLI structure 106.

At operation 604, an opening is formed in the second passivation layer. In the example shown in FIG. 7K, an opening 720 is formed in the second passivation layer 134. The opening 720 is aligned with the top surface 115 of the side portion 112 of the buried sacrificial structure 110 in the vertical direction. The opening 720 may be formed by a patterning and etching process to remove a portion of the second passivation layer 134.

Figure 7L:
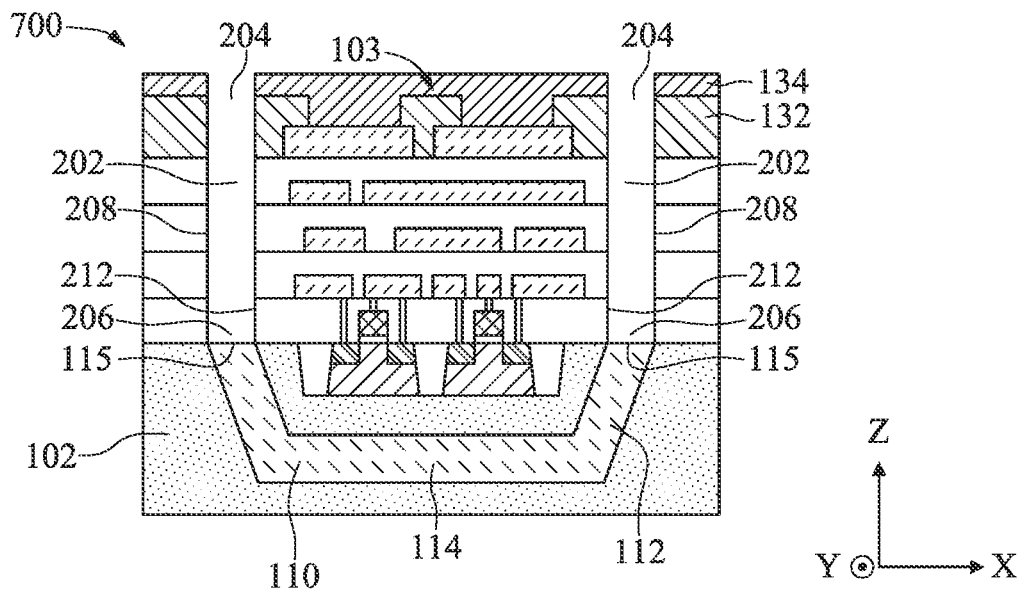

At operation 606, dicing trenches are formed to expose the top surfaces of the buried sacrificial structures. In the example shown in FIG. 7L, a dicing trench 202 is formed in the wafer substrate 102 for each die 103. The dicing trench 202 may be formed by a patterning and etching process, and multiple dicing trenches may be formed simultaneously or during the same process. In one example, a layer of photoresist is applied, and a photomask, containing the desired trench pattern, is aligned and exposed to light to expose specific areas of the photoresist. Then the exposed photoresist is developed to create a mask that protects the desired dicing trench locations in the wafer 700. An etching process, such as reactive ion etching (RIE) or deep reactive ion etching (DRIE) may be used to remove material from the unprotected regions of the wafer 700. The etchant gas used depends on the material being etched and can be a combination of gases like fluorine-based or chlorine-based gases. The etching process continues until the top surface 115 of the side portion 112 of the buried sacrificial structure 110 is exposed. The dicing trench 202 extends from a top open end 204 to a bottom open end 206 and is characterized by an inner sidewall 212 and an outer sidewall 208. The bottom open end 206 is connected to the top surface 115 of the side portion 112 of the buried sacrificial structure 110. It should be noted that the inner sidewall 212 will become a part of the exterior surface of the die 103 after the singulation process.

Figure 7M:
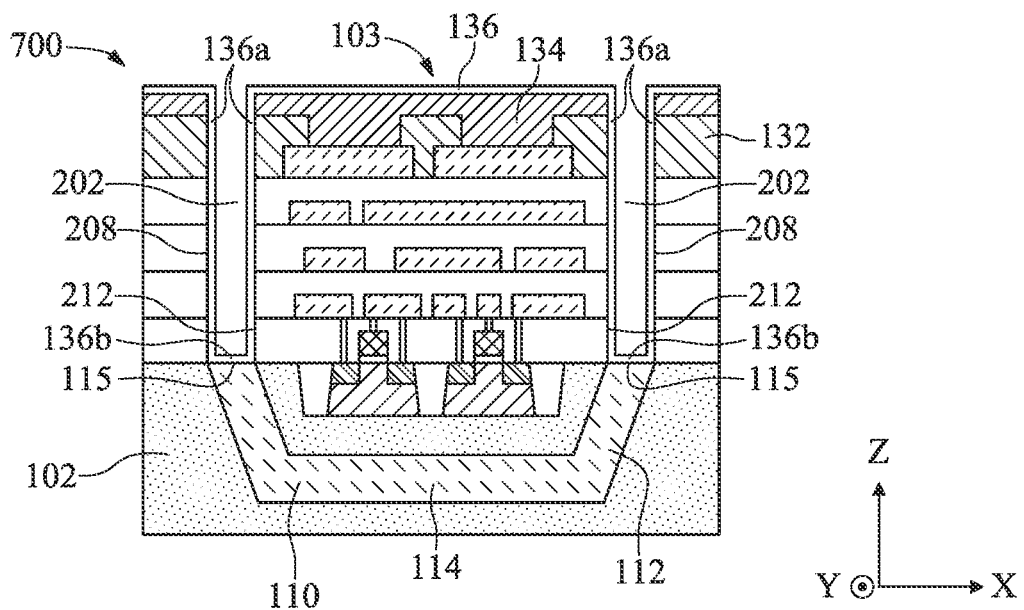

At operation 608, a third passivation layer is formed. In the example shown in FIG. 7M, a third passivation layer 136 is deposited on the second passivation layer 134. A portion of the third passivation layer 136, denoted as 136a, is deposited on the inner sidewall 212 and the outer sidewall 208 of the dicing trench 202. A portion of the third passivation layer 136, denoted as 136b, is formed at the bottom open end 206 and deposited on the top surface 115 of the side portion 112 of the buried sacrificial structure 110. As mentioned above, the portion 136a may serve as a protective layer for protection of the inner sidewall 212 (which becomes a part of the exterior surface of the die 103) during subsequent fabrication processes.

Figure 7N:
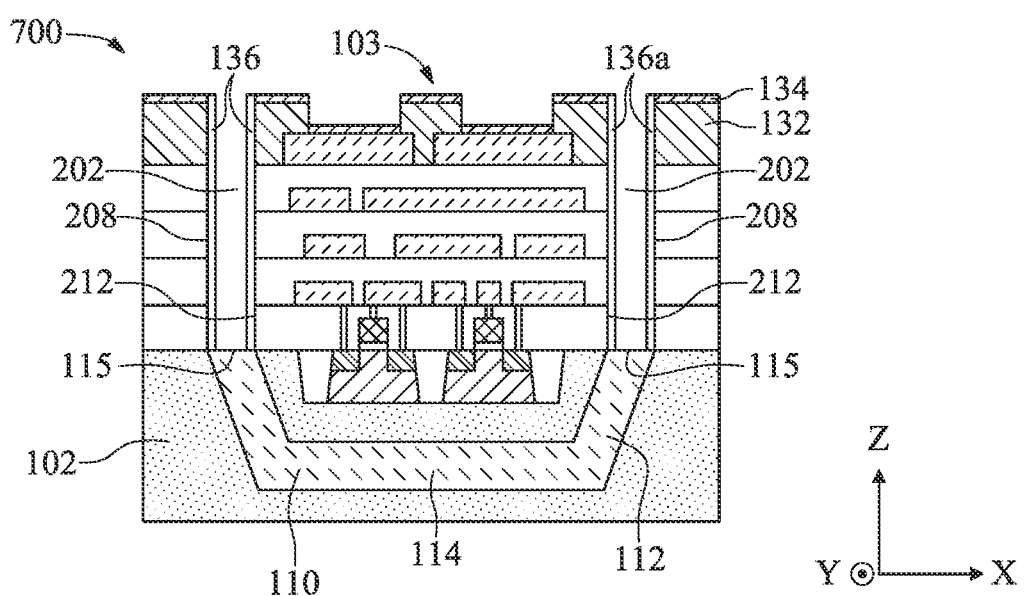

At operation 610, the third passivation layer is etched to expose the top surfaces of the buried sacrificial structures. In the example shown in FIG. 7N, the portion 136b of the third passivation layer 136 is removed to expose the top surface 115 of the side portion 112 of the buried sacrificial structure 110. An etching process may be performed using one or more etchants to remove the portion 136b of the third passivation layer 136. Examples of the etching techniques include wet etching, dry etching, plasma etching, reactive ion etching (RIE), or other suitable techniques. The choice of etchant and etching parameters (e.g., etch time, plasma parameters in the case of a plasma-based dry etching, chemistry of a wet etch, etc.) can be optimized to remove the portion 136b of the third passivation layer 136 and leave the portion 136a on the inner and outer sidewalls 208 and 212 intact.

Figure 7O:
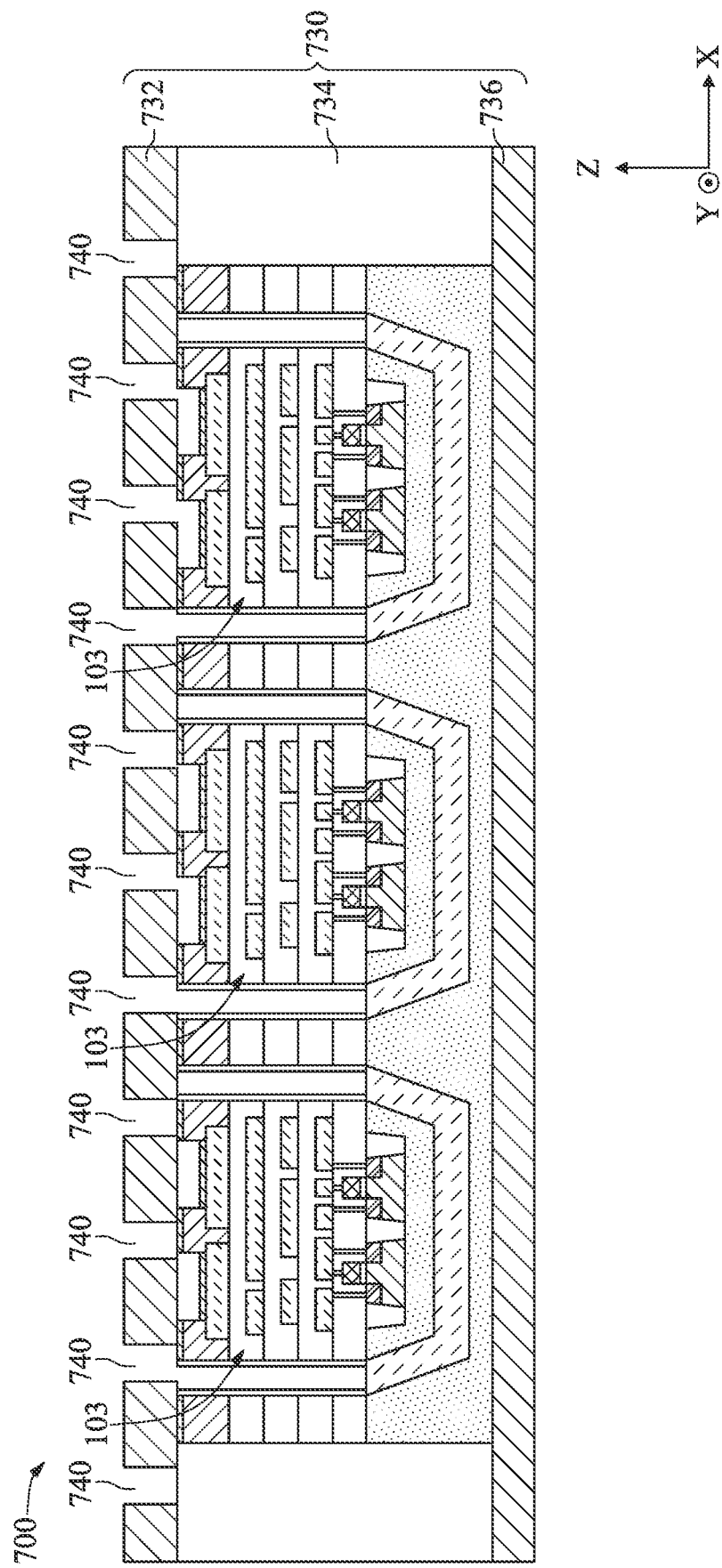
Figure 7P:
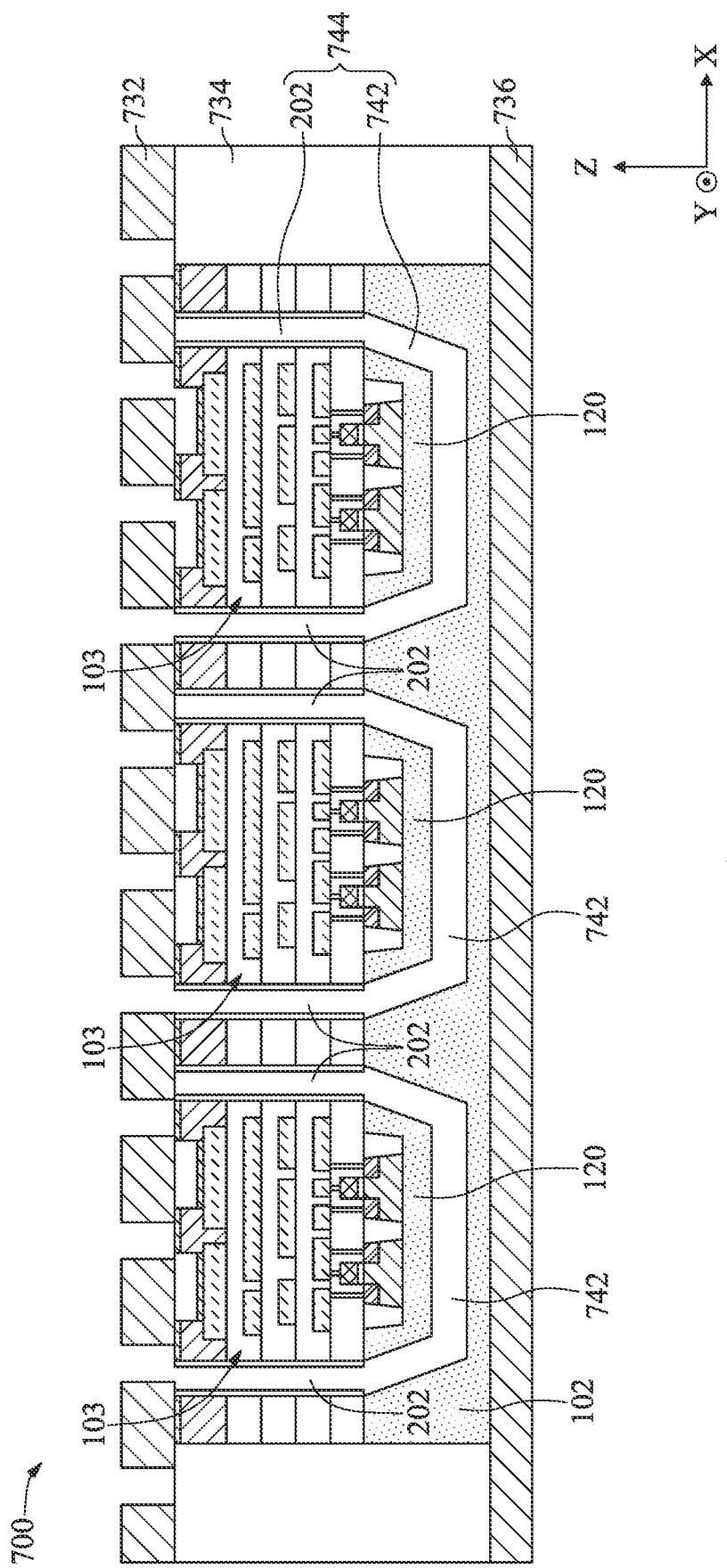
Figure 7Q:
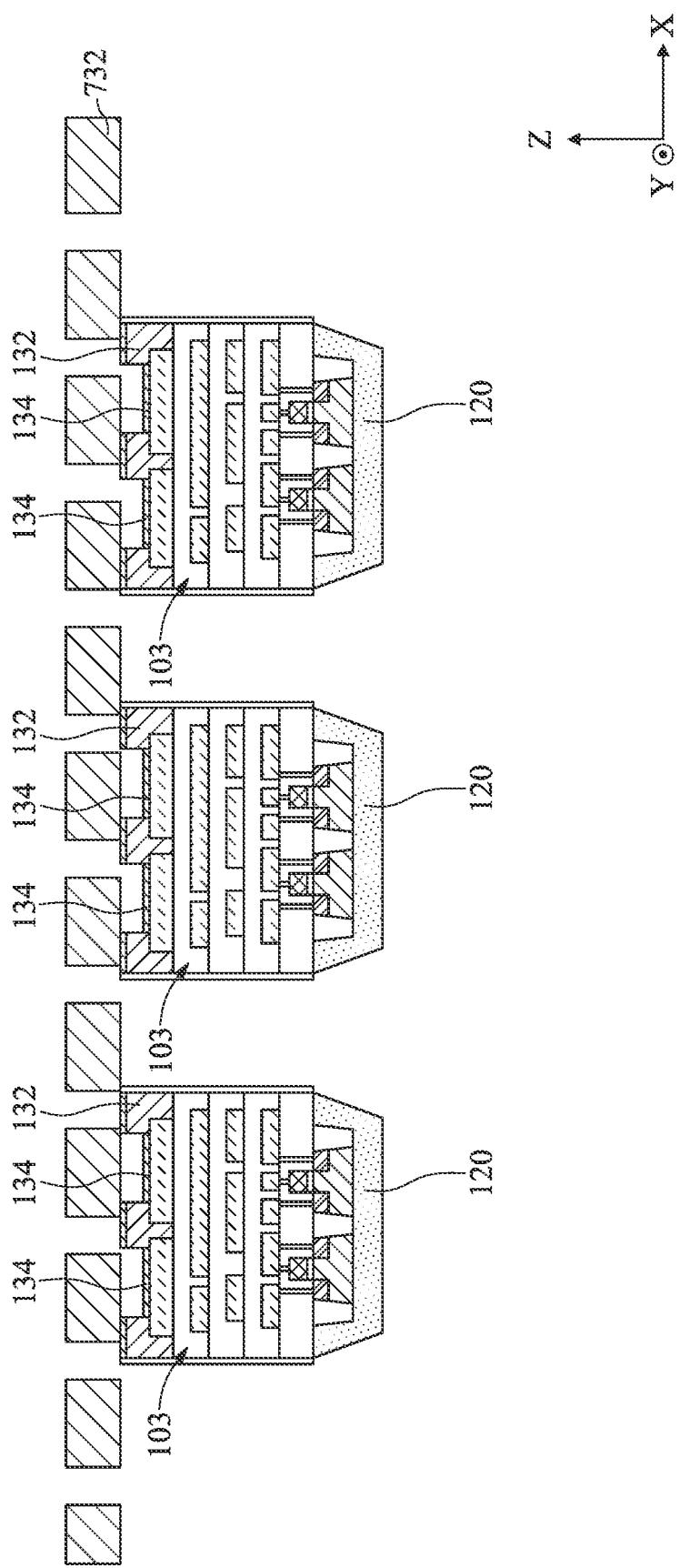
Figure 7R:
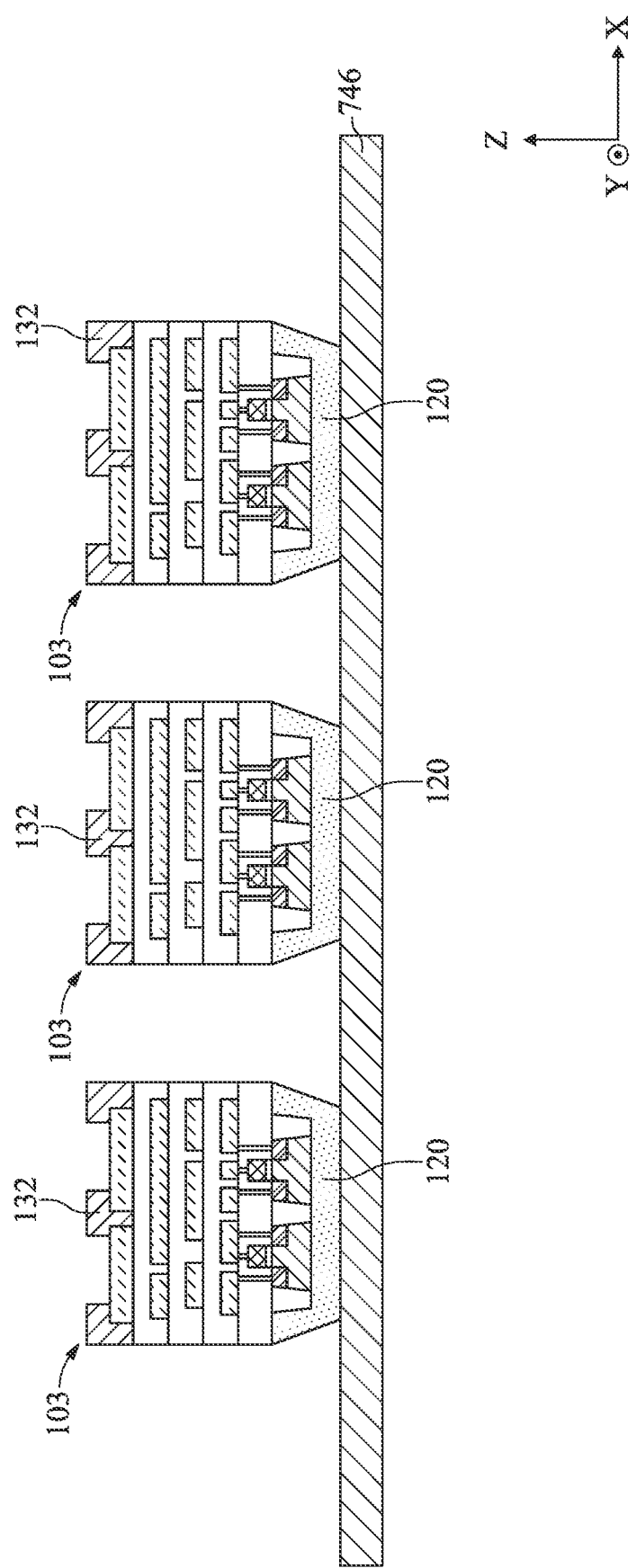

At operation 612, the wafer is attached to a pre-etch handle. In the example shown in FIG. 7O, the wafer 700 includes multiple dies 103 closely packed in the X-Y plane, in a manner similar to the wafer 100 shown in FIG. 1B. It should be understood that the wafer 700 of FIG. 7O is for illustrative purposes only, and the total number of the dies 103 in the wafer 700 may vary in alternative embodiments. The wafer 700 is attached to a pre-etch handle 730. The pre-etch handle 730 includes a wafer top carrier 732, a wafer bottom carrier 736, and a wafer holder 734 (also referred to as a "wafer chuck" or a "wafer fixed jig"). The wafer top carrier 732 is removably attached to the top surface of the wafer (i.e., the exposed surface of the passivation layers 132/134/136) and is configured to securely hold the top surface of the wafer. The wafer top carrier 732 may have a flat surface or grooves that match the size and shape of the wafer 700 and provides stability and protection during handling and processing. The wafer holder 734 is removably attached to the periphery of the wafer 700 and is configured to securely hold the wafer 700 in place by clamping or locking the wafer 700 into a desired position. The wafer holder 734 provides stability and prevents any movement or slippage of the wafer 700 during processing steps, such as etching or cleaning. The wafer bottom carrier 736 is removably attached to the backside or bottom surface of the wafer substrate 102 and is configured to support the backside or bottom surface of the wafer 700. Similar to the wafer top carrier 732, the wafer bottom carrier 736 can also match the size and shape of the wafer 700 and prevent damage or warping of the wafer during handling and processing. The wafer top carrier 732 and wafer bottom carrier 736 may be composed of any suitable material such as semiconductor, glass, or metal. In some embodiments, the wafer top carrier 732 and wafer bottom carrier 736 may each include an adhesive layer (not shown) used to removably bond to the top surface of the wafer 700 and the bottom surface of the wafer substrate 102.

In some embodiments, the wafer top carrier 732 includes multiple apertures 740 extending through the entire thickness of the wafer top carrier 732. The multiple apertures 740 may be in a relatively small dimension (i.e., substantially smaller than the horizontal dimension of the wafer 700). The number of the apertures 740 may vary depending on design requirements. The apertures 740 provide a passageway for an external etchant to be introduced into the dicing trench 202 in the subsequent step. The apertures 740 may also help with the alignment and orientation of the wafer 700 and may provide clear visibility and reference points for proper positioning of the wafer top carrier 732 to the wafer 700. The apertures 740 may also provide access for external sensors to be used to interact with the wafer 700 for detection and control during various processing steps. Multiple apertures 740 in the wafer top carrier 732 can help reduce the overall contact area between the wafer 700 and the wafer top carrier 732, which may facilitate the removal of the wafer top carrier 732 from the singulated dies 103 in subsequent steps.

At operation 614, the buried sacrificial structures are removed. In the example shown in FIG. 7P, the buried sacrificial structures may be removed using a selective etching process by introducing one or more etchants into the dicing trench 202 to selectively etch off the buried sacrificial structure 110 and leave the wafer substrate 102 and the die substrate 120 intact. Selective etching may be performed by using an etchant that selectively reacts with the material of the buried sacrificial structure 110 (e.g., $SiO_2$) while minimally affecting the surrounding materials (e.g., Si of the wafer substrate 102 and SiC of the die substrate 120). A subsurface void 742 is formed after the removal of the buried sacrificial structure 110. The subsurface void 742 takes substantially the same shape and size as the buried sacrificial structure 110 and is spatially connected to the dicing trench 202. The subsurface void 742 and the dicing trench 202 together can be viewed as a continuous dicing void 744, which surrounds and partially encloses the die substrate 120. As such, each die 103 is separated from the wafer substrate 102 by the corresponding dicing void 744 but is still attached to the wafer top carrier 732.

At operation 616, the wafer bottom carrier and the wafer holder are removed. In the example shown in FIG. 7Q, the wafer bottom carrier 736 and the wafer holder 734 are removed. The wafer substrate 102 bonded to the wafer bottom carrier 736 and the wafer holder 734 are also removed altogether. Thus, the individual dies 103 remain bonded to the wafer top carrier 732 in the same pattern as they were arranged in the wafer 700 before the wafer bottom carrier 736 and the wafer holder 734 are removed. The individual dies 103 are separate and isolated from each other.

At operation 618, the die substrates of the multiple dies are bonded to a bottom tape. The bottom tape is also known as a backside tape. As mentioned above, the die substrate of the die may have a relatively smaller thickness compared with the dies fabricated from the traditional scribe line and sawing process. The bottom tape can provide mechanical support and protection to the relatively thin dies 103 during subsequent processing steps. In the example shown in FIG. 7R, the bottom tape 746 is removably bonded to the back surface of the die substrates 120 of the dies 103.

At operation 620, the wafer top carrier is removed. Depending on the type of the adhesive layer used to bond the wafer top carrier and the top surfaces of the dies, the wafer top carrier may be removed by performing a mechanical removal process, a vacuum release process, a thermal release process, a chemical release process, or any combinations thereof.

At operation 622, the passivation layers on the die are removed to expose the topmost metal lines of the die. The passivation layer may be removed by performing an etching process. In some embodiments, a wet etching process may be performed using a chemical solution as an etchant to remove the passivation layer. In some embodiments, a dry etching process using plasma may be performed. In the example shown in FIG. 7R, the wafer top carrier 732 is removed, and the bottom tape 746 is removably bonded to the back surface of the die substrates 120. The second passivation layers (e.g., any unremoved third passivation layer 136, the second passivation layer 134, and a portion of the first passivation layer 132) of each die 103 are removed to expose the topmost metal lines (i.e., the metal lines of the topmost metallization layer of the MLI structure 106). The exposed topmost metal lines may be used to perform die performance tests before the bottom tape 746 is removed.

At operation 624, the die performance tests are performed, and the known-good dies are picked up. In some embodiments, the die performance tests are performed to test the dies when the dies are still bonded to the bottom tape. The dies that do not pass the performance tests are removed from the bottom tape. Once the dies have been tested and characterized, a singulation process is performed by removing the bottom tape to obtain the individual and singulated known-good dies.

The dies obtained after the singulation process have an exterior surface, for example, formed by the inner sidewall 212 of the dicing trench 202 as well as the sidewall 116 and the bottom surface 118 of die substrate 120 as shown in FIG. 2B. The exterior surface of the singulated die is substantially smoother as compared with the dies obtained from the traditional sawing process. As mentioned above, the etchants used in the process to form the dicing trench (i.e., the dicing trench 202) as well as the removal of the buried sacrificial structure (i.e., the buried sacrificial structure 110) may exhibit isotropic etching behavior, such that the material is removed uniformly in all directions, which may generate a smooth and even etch profile and minimize surface roughness. In addition, the selectivity of the etchant may facilitate precise control over the etching process in a gentle and mild manner to maintain a smooth and clean surface on the desired regions. In contrast, sawing involves using a saw blade or a laser to cut through the wafer along scribe lines, which almost always results in some surface roughness due to the physical cutting action and may leave residues or debris that are hard to clean. In some embodiments, the sidewall of the die 103 has a roughness Ra (arithmetic average roughness) less than 1 µm, less than 500 nm, less than 200 nm, less than 100 nm, less than 50 nm, less than 10 nm, or less than 5 nm.

It should be noted that the present method utilizing buried sacrificial layers is not limited solely to the singulation of dies as illustrated and described herein. The utilization of buried sacrificial layers can have broader applicability in various semiconductor fabrication and packaging applications, including but not limited to MEMS (Microelectromechanical Systems) and 3DIC (Three-Dimensional Integrated Circuits) packaging applications.

For example, in MEMS applications, the utilization of buried sacrificial layers provides significant advantages in the fabrication of suspended or movable structures, enabling the creation of MEMS devices such as microsensors, microactuators, and other microscale devices directly on the buried sacrificial layers. Unlike the traditional method that involves bonding a handle wafer (i.e., a top wafer) and a carrier wafer (i.e., a bottom wafer), fabricating the MEMS device in the handle wafer, and subsequently de-bonding the MEMS device from the carrier wafer using a mechanical separation method, the use of buried sacrificial layers eliminates the need for such mechanical separation processes. The selective etching of the sacrificial layers provides a non-destructive and efficient means of releasing the MEMS devices, as the sacrificial layers can be selectively etched away to allow the suspended or movable structures of the MEMS devices to be released while maintaining their intended functionality. This could effectively eliminate the risk of damage to the MEMS devices that can occur during the mechanical de-bonding process.

Similarly, in 3DIC packaging applications, the use of buried sacrificial layers can enable the fabrication of dies with specially designed shapes (e.g., the shapes illustrated in FIGS. 3A-3B). These specially shaped dies can be utilized to achieve specific functionalities or cater to specific usages. Another advantage of using buried sacrificial layers in 3DIC packaging is the ability to fabricate ultra-thin IC chips. The thickness of individual dies can be significantly reduced compared to traditional dies. The thickness of the die can be as low as 1 to 200 µm, as opposed to the typical thickness range of 600 to 100 µm for conventional dies. Consequently, the overall thickness of the 3DIC structure can be greatly minimized. The reduction in total thickness of the 3DIC structure can improve packaging efficiency. With thinner dies, the overall footprint of the 3DIC package is reduced, allowing for more compact and space-efficient integration. Furthermore, the utilization of buried sacrificial layers in 3DIC packaging applications can enable greater design flexibility. The specially shaped dies can be customized to fit specific requirements, allowing for enhanced functionality and optimization of the overall performance of the packaged product.

SUMMARY

In accordance with some aspects of the disclosure, a semiconductor wafer is provided. In one example, the semiconductor wafer has a plurality of die regions separated by a die spacing region and includes a wafer substrate, multiple dies disposed over the wafer substrate, and a buried sacrificial structure embedded in the wafer substrate. Each one of the multiple dies is located in the corresponding die region and further includes a die substrate extending vertically from a top surface to a bottom surface and comprising a sidewall circumferentially connecting the top surface and the bottom surface, an integrated circuit (IC) device disposed in the die substrate, and a multi-layer interconnect (MLI) structure disposed on and electrically connected to the IC device. The buried sacrificial structure is surrounding the die substrate and disposed between the die and the wafer substrate. The buried sacrificial structure further includes a bottom portion disposed in the die region and in contact with the bottom surface of the die substrate and a side portion circumferentially connected to the bottom portion. The side portion is located in the die spacing region surrounding the corresponding die and disposed on the sidewall of the die substrate and has a top surface co-planar with the top surface of the die substrate.

In accordance with some aspects of the disclosure, a method for fabricating a semiconductor wafer having a buried sacrificial structure is provided. In one example, the method includes forming a plurality of trenches in a wafer substrate. Each one of the plurality of trenches has a bottom surface and a sidewall circumferentially connected to the bottom surface. The method further includes forming an oxygen-implanted layer in each one of the plurality of trenches, forming a first silicon epitaxial layer on the oxygen-implanted layer to fill a portion of the trench, and performing an annealing process to convert the oxygen-implanted layer to a buried sacrificial structure. The buried sacrificial structure has a bottom portion disposed on the bottom surface of the trench and a side portion circumferentially connected to the bottom portion and disposed on the sidewall of the trench. The method further includes forming a second silicon epitaxial layer on the buried sacrificial structure to fill a remaining portion of the trench. The first silicon epitaxial layer and the second silicon epitaxial layer form a die substrate surrounded by the buried sacrificial structure. The method further includes performing a chemical-mechanical planarization (CMP) process to form substantially flat top surfaces of the die substrate and the side portion of the buried sacrificial structure.

In accordance with some aspects of the disclosure, a method for singulation of semiconductor dies is provided. In one example, the method includes providing a semiconductor wafer. The semiconductor wafer has multiple die regions separated by a die spacing region and includes a wafer substrate, multiple dies disposed over the wafer substrate, and a plurality of buried sacrificial structures corresponding to the plurality of dies. Each die is located in the corresponding die region and further includes a die substrate extending vertically from a top surface to a bottom surface and comprising a sidewall circumferentially connecting the top surface and the bottom surface and an IC device disposed in the die substrate. Each buried sacrificial structure is embedded in the wafer substrate and disposed between the corresponding die and the wafer substrate and further includes a bottom portion located in the die region and a side portion circumferentially connected to the bottom portion, the side portion located in the die spacing region and surrounding the sidewall of the corresponding die substrate. The method further includes forming a plurality of dicing trenches, each dicing trench located in the die spacing region surrounding the corresponding die. The dicing trench extends vertically from a top open end to a bottom open end and horizontally from an inner sidewall to an outer side wall, and the bottom open end is circumferentially connected to the side portion of the buried sacrificial structure. The method further includes attaching the wafer substrate to a pre-etch handle and performing an etching process to remove the plurality of buried sacrificial structures to form a plurality of subsurface voids. Each subsurface void and the corresponding dicing trench connected to the subsurface void form a continuous dicing void that separates the corresponding die from the wafer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer having a plurality of die regions separated by a die spacing region, the semiconductor wafer comprising:
   a wafer substrate;
   a plurality of dies corresponding to the plurality of die regions and disposed over the wafer substrate, each die located in the corresponding die region and comprising:
      a die substrate extending vertically from a top surface to a bottom surface and comprising a sidewall circumferentially connecting the top surface and the bottom surface;
      an integrated circuit (IC) device disposed in the die substrate; and
      a multi-layer interconnect (MLI) structure disposed on and electrically connected to the IC device; and
   a plurality of buried sacrificial structures corresponding to the plurality of dies and embedded in the wafer substrate, each buried sacrificial structure surrounding the corresponding die substrate and disposed between the corresponding die and the wafer substrate, wherein the buried sacrificial structure further comprises:
      a bottom portion disposed in the die region and in contact with the bottom surface of the die substrate; and
      a side portion circumferentially connected to the bottom portion, the side portion located in the die spacing region surrounding the corresponding die and disposed on the sidewall of the die substrate, wherein the side portion has a top surface co-planar with the top surface of the die substrate.

2. The semiconductor wafer of claim 1, wherein the side portion and bottom portion of the buried sacrificial structure have a thickness from about 0.2 to about 10 μm.

3. The semiconductor wafer of claim 1, wherein the buried sacrificial structure comprises silicon dioxide.

4. The semiconductor wafer of claim 1, wherein the wafer substrate and the die substrate are composed of the same material.

5. The semiconductor wafer of claim 1, wherein the wafer substrate comprises silicon (Si), and the die substrate comprises silicon carbide (SiC).

6. The semiconductor wafer of claim 1, wherein the die substrate has an angle (a) formed between the side portion and the bottom portion, and the angle (a) is at least 85 degrees.

7. The semiconductor wafer of claim 6, wherein the die substrate has an angle (a) formed between the side portion and the bottom portion, and the angle (a) is at least 120 degrees.

8. The semiconductor wafer of claim 1, wherein the die substrate has thickness from 2 μm to 200 μm.

9. The semiconductor wafer of claim 1, wherein the die spacing region between two adjacent die regions is less than 20 μm.

10. The semiconductor wafer of claim 1, further comprising a plurality of dicing trenches corresponding to the plurality of dies, the dicing trench located in the die spacing region and surrounding the corresponding die, wherein the dicing trench extends vertically from a top open end to a bottom open end and horizontally from an inner sidewall to an outer side wall, the bottom open end is circumferentially connected to the side portion of the buried sacrificial structure, and the top surface of the side portion of the buried sacrificial structure is exposed to the dicing trench.

11. The semiconductor wafer of claim 10, wherein the top opening is larger than the bottom opening in horizontal dimension.

12. The semiconductor wafer of claim 10, wherein the bottom opening is larger than the top surface of the side portion of the buried sacrificial structure in horizontal dimension.

13. The semiconductor wafer of claim 10, further comprising a passivation layer disposed on the inner sidewall and the outer sidewall in the dicing trench.

14. The semiconductor wafer of claim 10, wherein the inner sidewall has a surface roughness less than 1 μm.

15. A method for fabricating a semiconductor wafer having a buried sacrificial structure, the method comprising:
forming a plurality of trenches in a wafer substrate, each one of the plurality of trenches having a bottom surface and a sidewall circumferentially connected to the bottom surface;
forming an oxygen-implanted layer in each one of the plurality of trenches;
forming a first silicon epitaxial layer on the oxygen-implanted layer to fill a portion of the trench;
performing an annealing process to convert the oxygen-implanted layer to a buried sacrificial structure, the buried sacrificial structure having a bottom portion disposed on the bottom surface of the trench and a side portion circumferentially connected to the bottom portion and disposed on the sidewall of the trench;
forming a second silicon epitaxial layer on the buried sacrificial structure to fill a remaining portion of the trench, wherein the first silicon epitaxial layer and the second silicon epitaxial layer form a die substrate surrounded by the buried sacrificial structure; and
performing a chemical-mechanical planarization (CMP) process to form substantially flat top surfaces of the die substrate and the side portion of the buried sacrificial structure.

16. The method of claim 15, further comprising:
forming a plurality of dies over the wafer substrate, each one of the plurality of dies is formed on the corresponding die substrate and vertically aligned with the bottom portion of the buried sacrificial structure.

17. The method of claim 15, further comprising:
forming a passivation layer on top surfaces of the plurality of dies.

18. A method, comprising:
providing a semiconductor wafer, the semiconductor wafer having a plurality of die regions separated by a die spacing region and comprising:
a wafer substrate;
a plurality of dies corresponding to the plurality of die regions and disposed over the wafer substrate, each die located in the corresponding die region and comprising:
a die substrate extending vertically from a top surface to a bottom surface and comprising a sidewall circumferentially connecting the top surface and the bottom surface; and
an integrated circuit (IC) device disposed in the die substrate;
a plurality of buried sacrificial structures corresponding to the plurality of dies, each buried sacrificial structure embedded in the wafer substrate and disposed between the corresponding die and the wafer substrate and further comprising:
a bottom portion located in the die region; and
a side portion circumferentially connected to the bottom portion, the side portion located in the die spacing region and surrounding the sidewall of the corresponding die substrate,
forming a plurality of dicing trenches, each dicing trench located in the die spacing region surrounding the corresponding die, wherein the dicing trench extends vertically from a top open end to a bottom open end and horizontally from an inner sidewall to an outer side wall, the bottom open end is circumferentially connected to the side portion of the buried sacrificial structure;
attaching the wafer substrate to a pre-etch handle; and
performing an etching process to remove the plurality of buried sacrificial structures to form a plurality of subsurface voids, wherein each subsurface void and the corresponding dicing trench connected to the subsurface void form a continuous dicing void that separates the corresponding die from the wafer substrate.

19. The method of claim 18, further comprising:
depositing a passivation layer on the inner sidewall and outer sidewall of each trench before attaching the wafer substrate to the pre-etch handle.

20. The method of claim 18, wherein the pre-etch handle further comprises:
a wafer top carrier removably attached to a top surface of the plurality of dies; and
a wafer bottom carrier removably attached to a backside of the wafer substrate.

* * * * *